(12) United States Patent
Chiang et al.

(10) Patent No.: US 10,765,008 B2
(45) Date of Patent: Sep. 1, 2020

(54) METAL CLAD LAMINATE, PREPARATION METHOD THEREOF, AND METHOD FOR PREPARING FLEXIBLE CIRCUIT BOARD BY USING THE SAME

(71) Applicant: ETERNAL MATERIALS CO., LTD., Kaohsiung (TW)

(72) Inventors: Shun-Jen Chiang, Kaohsiung (TW); Chung-Jen Wu, Kaohsiung (TW); Meng-Yen Chou, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 600 days.

(21) Appl. No.: 15/185,946

(22) Filed: Jun. 17, 2016

(65) Prior Publication Data
US 2016/0374208 A1 Dec. 22, 2016

(30) Foreign Application Priority Data

Jun. 17, 2015 (TW) .............................. 104119714 A

(51) Int. Cl.
*B32B 15/08* (2006.01)
*B32B 27/28* (2006.01)
(Continued)

(52) U.S. Cl.
CPC .......... *H05K 3/0097* (2013.01); *B32B 15/08* (2013.01); *B32B 27/281* (2013.01);
(Continued)

(58) Field of Classification Search
CPC ... B32B 27/281; B32B 15/08; B32B 2457/08; B32B 2250/40; B32B 2307/748;
(Continued)

(56) References Cited

U.S. PATENT DOCUMENTS 4,675,246 A * 6/1987 Kundinger ............... B05D 7/16
428/336
5,300,364 A * 4/1994 Hase ...................... B32B 15/08
428/458

(Continued)

FOREIGN PATENT DOCUMENTS

| CN | 101164771 A | 4/2008 |
| CN | 101117384 A | 6/2008 |

(Continued)

OTHER PUBLICATIONS

Non-English Korean Office Action dated Apr. 19, 2018 for Korean Application No. 10-2016/0076088 with English translation.

(Continued)

*Primary Examiner* — John D Freeman
(74) *Attorney, Agent, or Firm* — Ladas & Parry LLP

(57) ABSTRACT

The present disclosure provides a metal clad laminate, a preparation method thereof, and a method for preparing a flexible circuit board by using the same. The metal clad laminate of the present disclosure includes a first metal foil, a first polyimide layer directly disposed on the first metal foil, a second metal foil, and a second polyimide layer directly disposed on the second metal foil, the first polyimide layer being in contact with the second polyimide layer. The metal clad laminate of the present disclosure is equivalent to a double-sided flexible copper clad laminate (FCCL) in structure, is superior to a single-sided FCCL in terms of mechanical performance in reducing warpage, and has the advantage of being useful for circuit fabrication simultaneously on both sides thereof.

20 Claims, 1 Drawing Sheet

(51) Int. Cl.
  *H05K 1/03* (2006.01)
  *H05K 3/00* (2006.01)
  *C09D 179/08* (2006.01)
  *H05K 3/02* (2006.01)

(52) U.S. Cl.
  CPC ......... *C09D 179/08* (2013.01); *H05K 1/0326* (2013.01); *H05K 1/0346* (2013.01); *H05K 3/022* (2013.01); *B32B 2250/04* (2013.01); *B32B 2250/40* (2013.01); *B32B 2307/748* (2013.01); *B32B 2457/08* (2013.01); *H05K 2201/0154* (2013.01); *H05K 2203/0143* (2013.01); *H05K 2203/1545* (2013.01)

(58) Field of Classification Search
  CPC .............. B32B 2250/04; C09D 179/08; H05K 3/0097; H05K 1/0326; H05K 1/0346; H05K 3/022; H05K 2203/0143; H05K 2201/0154; H05K 2203/1545
  See application file for complete search history.

(56) References Cited

U.S. PATENT DOCUMENTS

| | | | | |
|---|---|---|---|---|
| 5,922,167 | A | * | 7/1999 | Rosenfeld .......... C08G 73/1042 156/306.9 |
| 2005/0100719 | A1 | * | 5/2005 | Kanakarajan .......... C09J 179/08 428/209 |
| 2005/0245715 | A1 | | 11/2005 | Wu et al. |
| 2007/0044910 | A1 | | 3/2007 | Kuo et al. |
| 2008/0096997 | A1 | | 4/2008 | Wu et al. |
| 2010/0168265 | A1 | | 7/2010 | Wu et al. |
| 2010/0297455 | A1 | | 11/2010 | Wu et al. |

FOREIGN PATENT DOCUMENTS

| | | |
|---|---|---|
| CN | 101190969 A | 6/2008 |
| CN | 102361753 A | 2/2012 |
| CN | 103739842 A | 4/2014 |
| CN | 104191799 A | 12/2014 |
| CN | 104325774 A | 2/2015 |
| CN | 104859223 A | 8/2015 |
| EP | 0 496 334 A1 | 7/1992 |
| EP | 2008/004520 A1 | 1/2008 |
| JP | 1-286811 A | 11/1989 |
| JP | 4-239637 A | 8/1992 |
| JP | 6-112610 A | 4/1994 |
| JP | 11-240107 A | 9/1999 |
| JP | 2000-22288 A | 1/2000 |
| JP | 2007-273829 A | 10/2007 |
| JP | 2015-168261 A | 9/2015 |
| TW | 201107129 A1 | 3/2011 |
| TW | 201130888 A1 | 9/2011 |
| TW | 201511941 A | 4/2015 |

OTHER PUBLICATIONS

Espacenet English abstract of JP 1-286811 A.
Non-English Action dated Mar. 28, 2016 for Taiwan Application No. 104119714 with an English translation of the Search Report.
Espacenet English abstract of TW201107129 A1.
Espacenet English abstract of TW 201511941 A.
Espacenet English abstract of TW 201130888 A1.
Espacenet English abstract of CN 101190969 A.
Espacenet English abstract of CN 101117384 A.
Non-English Japanese Office Action dated Aug. 30, 2017 for Japanese Application No. 2016-121172 with an English translation.
Espacenet English abstract of JP 4-239637 A.
Espacenet English abstract of JP 11-240107 A.
Espacenet English abstract of 2007-273829 A.
Espacenet English abstract of JP 2015-168261 A.
Espacenet English abstract of JP 2000-22288 A.
Espacenet English abstract of JP 6-112610 A.
Official Action dated Feb. 10, 2018, issued in Chinese Patent Application 2015106670228.
English translation of search report included in the Official Action dated Feb. 10, 2018, issued in Chinese Patent Application 2015106670228.

\* cited by examiner

METAL CLAD LAMINATE, PREPARATION METHOD THEREOF, AND METHOD FOR PREPARING FLEXIBLE CIRCUIT BOARD BY USING THE SAME

CROSS REFERENCE TO THE RELATED APPLICATION

This application claims the benefit of priority to Taiwan Patent Application No. 104119714 filed Jun. 17, 2015, the content of which is incorporated herein by reference in its entity.

BACKGROUND OF THE INVENTION

1. Technical Field

The present disclosure relates to a metal clad laminate useful for a flexible printed circuit board, and a preparation method thereof. The present disclosure further relates to a method for preparing a flexible printed circuit board by using the metal clad laminate.

2. Description of the Related Art

A flexible printed circuit (FPC) board, due to its flexibility and bendability, enables three-dimensional wiring through adaptation to the size and shape of the product, and also is characteristically light and thin, making it one of the essential components in various high-tech devices such as cameras, video cameras, displays, disk drives, printers, mobile phones and other such devices.

A flexible metal clad laminate, for example, flexible copper clad laminate (FCCL), is an upstream material for a flexible printed circuit board. The existing FCCLs may be divided, in light of their structures, into three-layer FCCLs (3L FCCLs) with adhesive and two-layer FCCLs (2L FCCLs) without adhesive. The 3L FCCL is mainly formed by adhering a copper foil onto a polyimide layer by using an epoxy or acrylate resin adhesive as an intermediate layer. The 2L FCCL is made by a special process, contains no low heat-resistant adhesives such as epoxy or acrylate resins, and is thus more reliable. Moreover, 2L FCCL is better suited to development of thinner products, and thus is gradually replacing 3L FCCL in practice.

The FCCLs may be divided, in light of the circuit configuration requirements of the products (e.g., printed circuit boards), into single-sided and double-sided FCCLs. Single-sided FCCL is the most fundamental FCCL. It has a copper foil layer useful for circuit formulation clad only on one side thereof. Single-sided FCCL has the advantages of easy fabrication process, low cost, and good flexibility. Double-sided FCCL has a copper foil layer clad on both upper and lower sides. Accordingly, circuits may be formed on both sides of the double-sided FCCL, and may electrically connect to each other by a via hole. Therefore, double-sided FCCL can achieve a higher integration, is beneficial to controlling electrical resistance, and is useful for circuit fabrication simultaneously on both sides, so as to save time, but may suffer from potential poor flexibility due to greater thickness.

Single-sided FCCL has advantages such as being light, thin, and highly flexible. Double-sided FCCL has advantages such as good mechanical performance, electrical characteristics (e.g. low dielectric constant), and capacity for forming circuits on both sides. However, it is usually difficult for researchers in the art of FCCLs to pursue good operability while maintaining the above advantages at the same time. Therefore, there is still a need in the art for a FCCL that is light, thin and highly flexible, has good electrical characteristics, and requires less time and expense on subsequent processing.

SUMMARY

The present disclosure provides a metal clad laminate, a preparation method thereof, and a method for preparing a flexible circuit board by using the same, to solve the above problems.

The present disclosure provides a metal clad laminate, which comprises a first metal foil, a first polyimide layer directly disposed on the first metal foil, a second metal foil, and a second polyimide layer directly disposed on the second metal foil, wherein the first polyimide layer is in contact with the second polyimide layer.

In an embodiment of the present disclosure, at least one of the first polyimide layer and the second polyimide layer comprises in its composition a polymeric unit derived from a diaminosiloxane monomer, an alkylene diamine monomer or a combination thereof.

In an embodiment of the present disclosure, the first polyimide layer and the second polyimide layer each comprise in its composition a polymeric unit derived from a diaminosiloxane monomer, an alkylene diamine monomer or a combination thereof.

In an embodiment of the present disclosure, the diaminosiloxane monomer has a general formula (III) below:

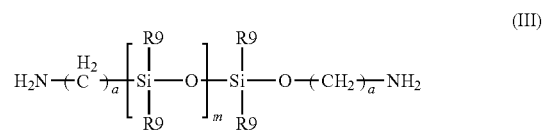

wherein each R9 is independently H, a linear or branched C1-C4 alkyl, or phenyl; a may be the same or different and is an integer ranging from 1 to 6; and m is an integer ranging from 1 to 15.

In an embodiment of the present disclosure, in the (□), each R9 is independently methyl, ethyl, or phenyl; a may be the same or different and is an integer ranging from 2 to 5; and m is an integer ranging from 1 to 5.

In an embodiment of the present disclosure, the diaminosiloxane monomer is selected from:

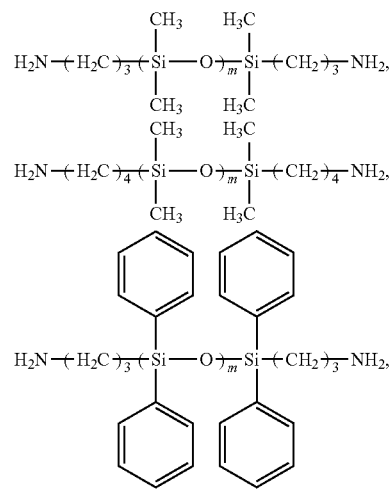

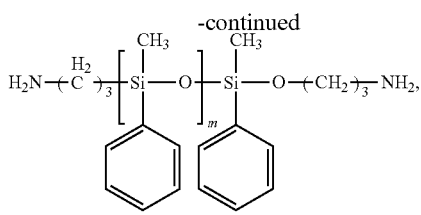

and a combination thereof, wherein m is an integer ranging from 1 to 5.

In an embodiment of the present disclosure, the alkylene diamine monomer has a general formula (IV) below:

$$H_2N-R_2-NH_2 \quad (IV)$$

wherein each $R_2$ is $C_2$-$C_{14}$ alkylene.

In an embodiment of the present disclosure, the alkylene diamine monomer is selected from:

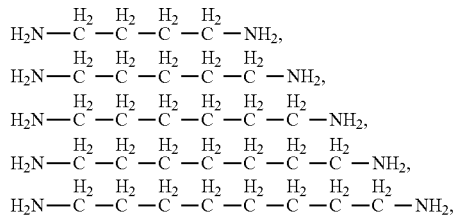

and a combination thereof.

In an embodiment of the present disclosure, the first polyimide layer and the second polyimide layer each have a glass transition temperature that is above 250° C. and preferably ranges from 260 to 340° C.

In an embodiment of the present disclosure, the first polyimide layer and the first metal foil, and the second polyimide layer and the second metal foil have a close or substantially the same coefficient of thermal expansion.

In an embodiment of the present disclosure, the first metal foil and the second metal foil each have a coefficient of thermal expansion ranging from 15 to 25 ppm/° C.

In an embodiment of the present disclosure, the first and second polyimide layer are formed by imidizing a precursor produced through condensation of a dianhydride monomer and a diamine monomer, the diamine monomer comprises a diaminosiloxane monomer, an alkylene diamine monomer, or a combination thereof and the total amount of the diaminosiloxane monomer and the alkylene diamine monomer is in the range from 0.1 to <10 mol %, based on the total moles of the diamine monomers.

In an embodiment of the present disclosure, the total amount of the diaminosiloxane monomer and the alkylene diamine monomer is in the range from 0.5 to 7.5 mol %, based on the total moles of the diamine monomers.

In an embodiment of the present disclosure, the total amount of the diaminosiloxane monomer and the alkylene diamine monomer is used in an amount in the range from 1 to <5 mol %, based on the total moles of the diamine monomers.

In an embodiment of the present disclosure, the dianhydride monomer is an aromatic dianhydride monomer.

In an embodiment of the present disclosure, the diamine monomer further comprises an aromatic diamine monomer.

In an embodiment of the present disclosure, the metal clad laminate is a quasi double-sided two layer metal clad laminate or a double-sided two-layer metal clad laminate.

In an embodiment of the present disclosure, the metal clad laminate is a quasi double-sided two layer metal clad laminate, wherein the peeling strength between the first polyimide layer and the second polyimide layer is 1 to 500 gf/cm.

In an embodiment of the present disclosure, the metal clad laminate is a quasi double-sided two layer metal clad laminate, wherein the peeling strength between the first polyimide layer and the second polyimide layer is 3 to 100 gf/cm.

In an embodiment of the present disclosure, the metal clad laminate is a quasi double-sided two layer metal clad laminate, wherein the peeling strength between the first polyimide layer and the second polyimide layer is 5 to 50 gf/cm.

In an embodiment of the present disclosure, the metal clad laminate is a double-sided two layer metal clad laminate, wherein the peeling strength between the first polyimide layer and the second polyimide layer is above 500 gf/cm.

In an embodiment of the present disclosure, the first metal foil and the second metal foil are each independently selected from a copper foil, an aluminium foil or a copper-aluminium alloy foil.

The present disclosure provides a method for preparing the metal clad laminate, which comprises:

(a) providing a first metal film comprising a first metal foil and a first polyimide layer directly disposed on the first metal foil;

(b) providing a second metal film comprising a second metal foil and a second polyimide layer directly disposed on the second metal foil; and (c) superposing the first polyimide layer of the first metal film onto the second polyimide layer of the second metal film and laminating.

In an embodiment of the present disclosure, the first polyimide layer and the second polyimide layer used in the method each have a glass transition temperature that is in the range of 260 to 340° C.

In an embodiment of the present disclosure, the lamination temperature in step (c) is controlled at 300 to 390° C., and the lamination line pressure is controlled at 1 to 60 kgf/cm, such that the peeling strength between the first polyimide layer and the second polyimide layer is 1 to 500 gf/cm, and the metal clad laminate is a quasi double-sided two-layer metal clad laminate.

In an embodiment of the present disclosure, the lamination temperature in step (c) is controlled at 350 to 400° C., and the lamination line pressure is controlled at 100 to 200 kgf/cm, such that the peeling strength between the first polyimide layer and the second polyimide layer is greater than 500 gf/cm, and the metal clad laminate is a double-sided two-layer metal clad laminate.

The present disclosure provides a method for preparing a flexible circuit board by using the quasi double-sided two-layer metal clad laminate, which further comprises the steps of: forming at least one circuit unit respectively on the surface of the first metal foil and the surface of the second metal foil; and separating the first polyimide layer from the second polyimide layer, to form two single-sided flexible circuit boards.

In an embodiment of the present disclosure, the method for preparing a single-sided flexible circuit board further comprises preparing the quasi double-sided two-layer metal clad laminate according to the method described above.

The present disclosure further provides a method for preparing a flexible circuit board by using the double-sided two-layer metal clad laminate, which further comprises the steps of: forming at least one circuit unit respectively on the surface of the first metal foil and the second metal foil of the metal clad laminate, to prepare a double-sided flexible circuit board.

In an embodiment of the present disclosure, the method for preparing a double-sided flexible circuit board further comprises preparing the double-sided two-layer metal clad laminate according to the method described above.

Based on the foregoing, in the metal clad laminate and the preparation method thereof provided in the present disclosure, the first polyimide layer is directly disposed on and adhered to the first metal foil, and the second polyimide layer is directly disposed on and adhered to the second metal foil, with no need to additionally apply an adhesive or a thermoplastic polyimide (TPI) layer between the metal foil and the polyimide layer to provide an adhesion effect. Accordingly, the process for preparing the metal clad laminate is simplified, and the obtained metal clad laminate has good heat resistance and is applicable to a high-temperature manufacturing process, which is beneficial to the fabrication of semi-conductor components.

To make the objectives, technical features and advantages of the present disclosure clear and comprehensible, detailed description is given below by way of some specific embodiments.

BRIEF DESCRIPTION OF THE DRAWINGS

The invention will be described according to the appended drawings, in which.

DETAILED DESCRIPTION

For ease of understanding the present disclosure, several terms are defined hereinafter.

The term "about" means an acceptable error of a particular value determined by those of ordinary skill in the art, the range of which depends on how the value is measured or determined.

In the present disclosure, the term "alkyl" refers to a saturated, straight or branched hydrocarbon group, which comprises preferably 1-14 carbon atoms, and more preferably 1-6 or 1-4 carbon atoms. Examples of alkyl include, but are not limited to, methyl, ethyl, propyl (such as n-propyl and isopropyl), butyl (such as n-butyl, sec-butyl, isobutyl and tert-butyl), pentyl, hexyl, or similar groups.

In the present disclosure, the term "alkenyl" refers to an unsaturated, straight or branched hydrocarbon group containing at least one carbon-carbon double bond, which comprises preferably 2-10 carbon atoms, and more preferably 3-8 carbon atoms. Examples include, but are not limited to, ethenyl, propenyl, methyl propenyl, isopropenyl, pentenyl, hexenyl, heptenyl, 1-propenyl, 2-butenyl, 2-methyl-2-butenyl and similar groups.

In the present disclosure, the term "aryl" or "aromatic" refers to a monocyclic, bicyclic or tricyclic aromatic ring system having 6 to 14 ring carbon atoms. Examples of aryl include, but are not limited to, phenyl, tolyl, naphthyl, fluorenyl, anthryl, phenanthrenyl and similar groups.

In the present disclosure, the term "halogenated alkyl" refers to an alkyl substituted with a halogen, wherein the "halogen" denotes fluorine, chlorine, bromine or iodine.

In the present disclosure, the term "alkoxy" refers to an alkyl attached to an oxygen atom, which comprises preferably 1-8 carbon atoms, and more preferably 1-4 carbon atoms.

In the present disclosure, the term "adhesion upon hot pressing" refers to the adhesion between one polyimide resin layer and another polyimide resin layer that is generated by applying proper heat and pressure.

Figure 1:
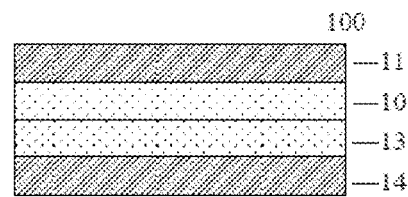
FIG. 1 is a schematic view of a metal clad laminate according to the present disclosure.

FIG. 1 is a schematic view of a metal clad laminate according to the present disclosure. As shown in FIG. 1, a metal clad laminate 100 of the present disclosure is useful in the production of a flexible printed circuit board, and comprises a first metal foil 11; a first polyimide layer 10 directly disposed on the first metal foil 11; a second metal foil 14; and a second polyimide layer 13 directly disposed on the second metal foil 14. The first polyimide layer and the first metal foil, and the second polyimide layer and the second metal foil have a close or substantially the same coefficient of thermal expansion.

According to the present disclosure, the first metal foil and the second metal foil are each a metal or alloy having a coefficient of thermal expansion ranging from about 15 to about 25 ppm/° C., for example, but not limited to: aluminium, copper, silver, an alloy containing any combination of aluminium, copper, and silver, or other alloys having a coefficient of thermal expansion ranging from about 15 to about 25 ppm/° C. According to a preferred embodiment of the present disclosure, the first metal foil and the second metal foil are a copper foil, an aluminium foil or a copper-aluminium alloy foil. The copper foil refers to a foil composed of copper or having copper as the main component (for example, a foil with a copper content of 90 wt % or more), and may be selected from the group consisting of rolled annealed copper foil (Ra copper foil), electrodeposited copper foil (ED copper foil) and a combination thereof. The aluminium foil refers to a foil made of aluminium or having aluminium as the main component (for example, a foil with an aluminium content of 90 wt % or more). The definitions of other metal foils may be deduced by analogy.

The thickness of the first metal foil and the second metal foil is not particularly limited, and generally ranges from about 0.05 to about 50 μm, preferably from about 0.1 to about 35 μm, and more preferably from about 5 to about 20 μm.

According to the present disclosure, the first polyimide layer 10 is directly disposed on and adhered to the first metal foil 11, and the second polyimide layer 13 is directly disposed on and adhered to the second metal foil 14, with no need to additionally apply an adhesive or a thermoplastic polyimide (TPI) layer between the metal foil and the polyimide layer to provide an adhesion effect. Accordingly, the process for preparing the metal clad laminate is simplified, and the obtained metal clad laminate has good heat resistance and is applicable to a high-temperature manufacturing process, which is beneficial to the fabrication of semiconductor components.

Generally, as an insulating support layer, the polyimide layer needs to have excellent thermal stability, and thus thermosetting polyimides having a highly symmetric structure are used. However, the adhesion strength between two thermosetting polyimide layers is poor. Therefore, a thermoplastic polyimide (TPI) layer is applied onto the surface of one of the thermosetting polyimide layers in the industry. By virtue of the properties of the thermoplastic polyimide, the thermoplastic polyimide is softened and melted by heating, and deformed and bonded to the other thermosetting polyimide layer under pressure. After the temperature is lowered, the two thermosetting polyimide layers are adhered together through the thermoplastic polyimide layer.

Another technical feature of the present disclosure is that the first polyimide layer 10 is brought into direct contact with and adhesion to the second polyimide layer 13, with no need to additionally apply a thermoplastic polyimide layer. At least one and preferably both of the first polyimide layer 10 and the second polyimide layer 13 in the present disclosure comprise a polymeric unit derived from diaminosiloxane. Therefore, adhesion may occur when the first polyimide layer 10 is brought into contact with the second polyimide layer 13, such that no thermoplastic polyimide is needed, thereby simplifying the manufacturing process.

In the present disclosure, the thickness of the polyimide layer is not particularly limited, and may be adjusted, depending on the nature of the raw material and the desired property of the product. According to an embodiment of the present disclosure, the thickness of the first polyimide layer and the second polyimide layer may each range from about 1 to about 90 μm, preferably from about 3 to about 50 μm, and more preferably from about 5 to about 30 μm.

The first polyimide layer and the second polyimide layer in the present disclosure are a thermosetting polyimide layer. Analogous to a general method for preparing a polyimide, the first and second polyimide layers are formed by imidizing a precursor produced through condensation of a dianhydride monomer and a diamine monomer, and may be prepared by using, for example, a polyamic acid (which is also referred to as polyimide precursor) as a precursor. The reaction scheme for preparing a polyimide by using a polyamic acid may be briefly described as follows (where Ar and Ar' are a tetravalent and a divalent organic group, respectively; and n is the number of polymeric units):

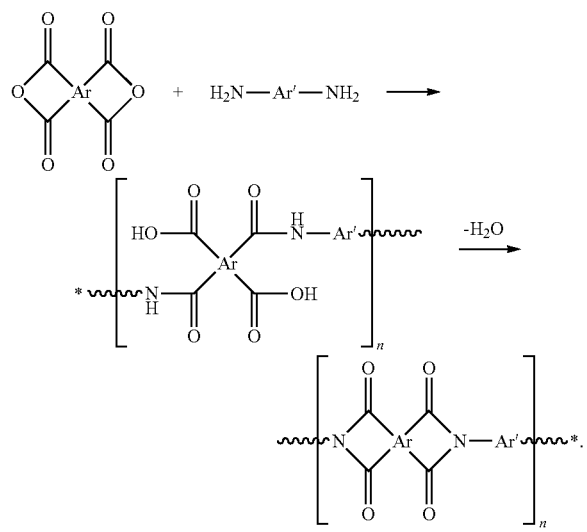

In the preparation method shown in the above reaction scheme, the diamine monomer is dissolved in a polar aprotic solvent, and then condensed with equal moles of the dianhydride monomer, to form a precursor (that is, a polyamic acid) for preparing the polyimide. Then, the polyamic acid is imidized by heating, further dehydrated and cyclized, to form a polyimide.

Alternatively, other polyimide precursor or precursor composition may be used to prepare a polyimide, including, but not limited to, a polyimide precursor having a formula (I) below:

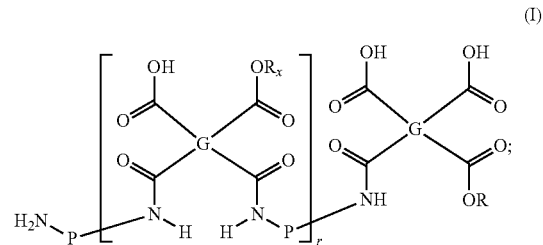

a polyimide precursor composition including:

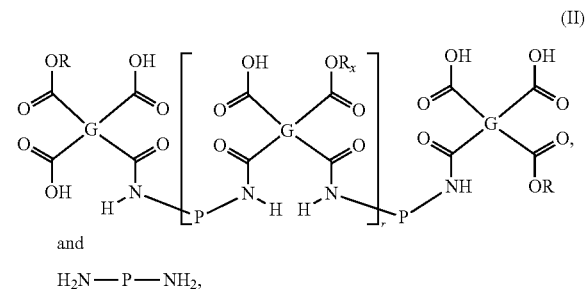

and $$H_2N-P-NH_2,$$

wherein G is a tetravalent organic group, P is a divalent organic group, r is an integer ranging from 0 to 100 (and preferably from 1 to 90), $R_x$ is each independently H or a photosensitive group, and R is an organic group.

Various technologies relating to the polymerization and cyclization methods of polyimide precursors and to polyimides made therefrom are described in, for example, U.S. patent application Ser. Nos. 11/785,827, 11/119,555, 12/846,871, and 12/572,398, and Chinese Patent Application Nos. CN200610162485.X, and CN200710138063.3, which are incorporated herein by reference in their entirety.

The dianhydride monomer useful for preparing the polyimide precursor or the polyimide precursor composition is generally an aliphatic or aromatic dianhydride, and preferably an aromatic dianhydride if high chemical resistance is desired. Examples include, but are not limited to, pyromellitic dianhydride (PMDA), 3,3',4,4'-biphenyltetracarboxylic dianhydride (BPDA), 4,4'-diphthalic dianhydride, 4,4'-hexafluoroisopropylidene-2,2-bis-(phthalic acid anhydride) (6FDA), 1-(trifluoromethyl)-2,3,5,6-benzenetetracarboxylic dianhydride (P3FDA), benzophenone-tetracarboxylic dianhydride (BTDA), 3,3',4,4'-diphenylether tetracarboxylic dianhydride (ODPA), 1,4-bis(trifluoromethyl)-2,3,5,6-benzene tetracarboxylic dianhydride (P6FDA), 1-(3',4'-dicarboxyphenyl)-1,3,3-trimethylindan-5,6-dicarboxylic dianhydride, 1-(3',4'-dicarboxyphenyl)-1,3,3-trimethylindan-6,7-dicarboxylic dianhydride, 1-(3',4'-dicarboxyphenyl)-3-methylindan-5,6-dicarboxylic dianhydride, 1-(3',4'-dicarboxyphenyl)-3-methylindan-6,7-dicarboxylic dianhydride, 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-2,4,5,8-tetracarboxylic dianhydride, phenanthrene-1,8,9,10-tetracarboxylic dianhydride, 3,3',4,4'-benzophenonetetracarboxylic dianhydride, 1,2',3,3'-benzophenonetetracarboxylic dianhydride, 3,3',4, 4'-benzophenonetetracarboxylic dianhydride, 2,2',3,3'-biphenyltetracarboxylic dianhydride, 4,4'-isopropylidenediphthalic dianhydride, 3,3'-isopropylidenediphthalic dianhydride, 4,4'-oxydiphthalic dianhydride, 4,4'-sulfonyldiphthalic dianhydride, 3,3'-oxydiphthalic dianhydride, 4,4'-methylenediphthalic dianhydride, 4,4'-sulfodiphthalic dianhydride, 4,4'-ethylidenediphthalic dianhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzene-1,2,3,4-tetracarboxylic dianhydride, pyridine-2,3,5,6-tetracarboxylic dianhydride, 1,2,3,4-cyclobutanetetracarboxylic dianhydride (CBDA), 5,5'-(9H-fluorene-9,9-diyl)diisobenzofuran-1,3-dione (BPAF), or a combination thereof.

Preferably, an aromatic dianhydride selected from the following group is used: pyromellitic dianhydride (PMDA), 3,3',4,4'-biphenyltetracarboxylic dianhydride (BPDA), 4,4'-diphthalic dianhydride, 4,4'-hexafluoroisopropylidenediphthalic dianhydride (6FDA), 1-(trifluoromethyl)-2,3,5,6-benzenetetracarboxylic dianhydride (P3FDA), 1,4-bis(trifluoromethyl)-2,3,5,6-benzenetetracarboxylic dianhydride (P6FDA), benzophenone-tetracarboxylic dianhydride (BTDA), 3,3',4,4'-diphenylether tetracarboxylic dianhydride (ODPA), 1,2,3,4-cyclobutanetetracarboxylic dianhydride (CBDA), 5,5'-(9H-fluorene-9,9-diyl)diisobenzofuran-1,3-dione (BPAF) and a combination thereof.

The diamine monomer useful for preparing the polyimide precursor or the polyimide precursor composition is generally an aromatic diamine that is known to those skilled in the art. The diamine monomer may be selected from the group consisting of, for example, but without limitation to, 4,4'-oxydianiline (ODA), p-phenylene diamine (pPDA), m-dimethyl p-diamino biphenyl (DMDB), 2,2'-bis(trifluoromethyl)benzidine (TFMB), o-dimethyl p-diamino biphenyl (o-Tolidine; oTLD), 4,4'-octafluorobenzidine (OFB), tetrafluoro-p-phenylene diamine (TFPD), 2,2'-5,5'-tetrachlorobenzidine (TCB), 3,3'-dichlorobenzidine (DCB), 2,2'-bis(3-aminophenyl)hexafluoropropane, 2,2'-bis(4-aminophenyl)hexafluoropropane, 4,4'-oxy-bis[3-(trifluoromethyl)aniline, 3,5-diaminobenzotrifluoride, tetrafluoro-1,4-phenylene diamine, tetrafluoro-m-phenylene diamine, 1,4-bis(4-aminophenoxy)-2-tert-butyl benzene (BATB), 2,2'-dimethyl-4,4'-bis(4-aminophenoxy)biphenyl (DBAPB), 4,4'-diaminodicyclohexylmethane (MDCA), 2,2-bis[4-(4-aminophenoxy)phenyl]hexafluoropropane (BAPPH), 2,2'-bis[4-(4-aminophenoxy)phenyl]norbornane (BAPN), 5-amino-1-(4'-aminophenyl)-1,3,3-trimethyl indane, 6-amino-1-(4'-aminophenyl)-1,3,3-trimethyl indane, 4,4'-methylenebis(o-chloroaniline), 3,3'-dichlorodianiline, 3,3'-sulfonyldianiline, 4,4'-diaminobenzophenone, 1,5-diaminonaphthalene, bis(4-aminophenyl)diethyl silane, bis(4-aminophenyl)diphenyl silane, bis(4-aminophenyl)ethyl phosphine oxide, N-(bis(4-aminophenyl))-N-methylamine, N-(bis(4-aminophenyl))-N-phenylamine, 4,4'-methylenebis(2-methylaniline), 4,4'-methylenebis(2-methoxy aniline), 5,5'-methylenebis(2-aminophenol), 4,4'-methylenebis(2-methylaniline), 4,4'-oxybis(2-methoxyaniline), 4,4'-oxybis(2-chloroaniline), 2,2'-bis(4-aminophenol), 5,5'-oxybis(2-aminophenol), 4,4'-thiobis(2-methylaniline), 4,4'-thiobis(2-methoxyaniline), 4,4'-thiobis(2-chloroaniline), 4,4'-sulfonylbis(2-methylaniline), 4,4'-sulfonylbis(2-ethoxyaniline), 4,4'-sulfonylbis(2-chloroaniline), 5,5'-sulfonylbis(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylene diamine, 4,4'-methylenedianiline (MDA), 4,4'-thiodianiline, 4,4'-sulfonyldianiline, 4,4'-isopropylidenedianiline, 3,3'-dimethoxybenzidine, 3,3'-dicarboxybenzidine, 2,4-tolyldiamine, 2,5-tolyldiamine, 2,6-tolyldiamine, m-xylylenediamine, 2,4-diamino-5-chlorotoluene, 2,4-diamino-6-chlorotoluene, 1,4-diaminocyclohexane (CHDA), 4-(9-(4-aminophenyl)-9H-fluoren-9-yl)benzenamine (BAFL), 9-(4-aminophenyl)-9-phenyl-9H-fluoren-3-amine, 1-(4-aminophenyl)-2,3-dihydro-1,3,3-trimethyl-1H-inden-5-amine (TMDA) and a combination thereof.

Preferably, 4,4'-oxydianiline (ODA), p-phenylene diamine (pPDA), m-dimethyl p-diaminobiphenyl (DMDB), 2,2'-bis(trifluoromethyl)benzidine (TFMB), o-dimethyl p-diamino biphenyl (oTLD), 4,4'-methylenedianiline (MDA), 4,4'-diaminodicyclohexylmethane (MDCA), 1,4-diaminocyclohexane (CHDA), 4-(9-(4-aminophenyl)-9H-fluoren-9-yl)aniline (BAFL), 9-(4-aminophenyl)-9-phenyl-9H-fluorenyl-3-amine, 1-(4-aminophenyl)-2,3-dihydro-1,3,3-trimethyl-1H-inden-5-amine (TMDA), or a combination thereof is used.

To allow the polyimide layer to have superior thermal stability, mechanical properties, electrical properties, and chemical resistance, it is more preferable to use an aromatic dianhydride and diamine selected from the following groups:

dianhydride: pyromellitic dianhydride (PMDA), 3,3',4,4'-biphenyltetracarboxylic dianhydride (BPDA), 4,4'-hexafluoroisopropylidene-2,2-bis(phthalic acid anhydride) (6FDA), benzophenone-tetracarboxylic dianhydride (BTDA), 3,3',4,4'-diphenyl ether tetracarboxylic dianhydride (ODPA) and a combination thereof;

diamine: 4,4'-oxydianiline (ODA), p-phenylene diamine (pPDA), m-dimethyl p-diaminobiphenyl (DMDB), 2,2'-bis(trifluoromethyl)benzidine (TFMB) or a combination thereof.

To prepare a adhesive polyimide layer, in addition to the aromatic diamine monomer described above, the diamine monomer should further includes a diaminosiloxane monomer, an alkylene diamine monomer, or a combination thereof. The diaminosiloxane, the alkylene diamine monomer and the aromatic diamine react with the dianhydride, to produce a polyamic acid.

As described above, the first polyimide layer 10 and the second polyimide layer 13 comprise in its composition a polymeric unit derived from a diaminosiloxane, such that adhesion occurs when the first polyimide layer 10 is brought into contact with the second polyimide layer 13.

The diaminosiloxane monomer useful in the present disclosure is not particularly limited, and is preferably a diaminosiloxane monomer having formula (III) below:

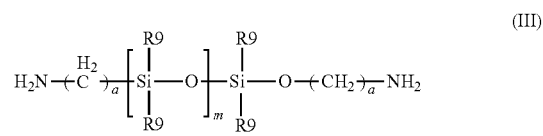

(III)

where R9 is each independently H, a linear or branched C1-C4 alkyl, or phenyl, preferably methyl, ethyl or phenyl, and more preferably methyl or phenyl; a may be the same or different and is an integer greater than 0, preferably ranges from 1 to 6, and more preferably ranges from 2 to 5; and m is an integer greater than 0, preferably ranges from 1 to 15, and more preferably ranges from 1 to 5.

According to an embodiment of the present disclosure, the diaminosiloxane monomer used may be:

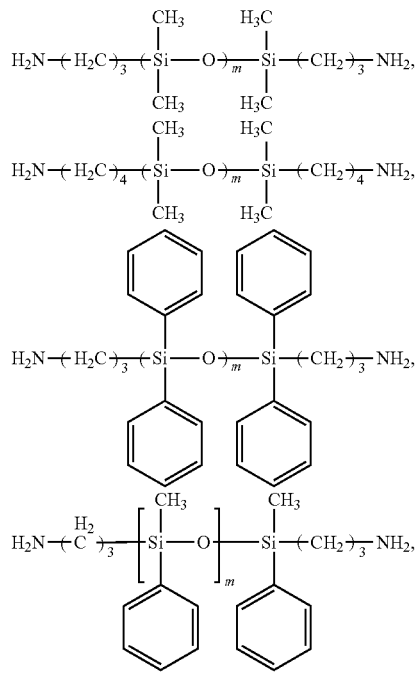

or a combination thereof, wherein m is an integer ranging from 1 to 5.

The alkylene diamine monomer useful in the present disclosure is not particularly limited, and is preferably an alkylene diamine monomer having formula (IV) below:

$$H_2N-R_2-NH_2 \quad (IV)$$

wherein each $R_2$ is $C_2$-$C_{14}$ alkylene, and preferably $C_3$-$C_8$ alkylene, for example, propylene, butylene, pentylene, hexylene, heptylene, octylene or nonamethylene.

According to an embodiment of the present disclosure, the alkylene diamine monomer may be:

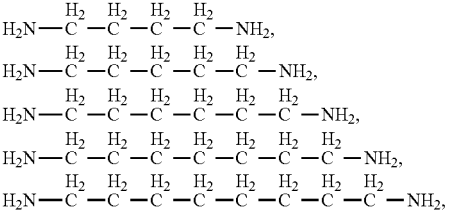

or a combination thereof.

According to an embodiment of the present disclosure, the total amount of the diaminosiloxane monomer and the alkylene diamine may be in the range of about 0.1 to <10 mol %, preferably about 0.5 to about 7.5 mol %, and more preferably about 1 to about <5 mol %, based on the total moles of the diamine monomers. When the total content of the diaminosiloxane monomer and the alkylene diamine is too high (for example, higher than 10 mol %), then the glass transition temperature is too low, the mechanical strength (for example, tensile strength and breaking strength), the dimensional stability, and the flame retardance are poor, and the coefficient of thermal expansion of the polyimide layer is too large, such that the prepared laminate is prone to warpage. When the total content of the diaminosiloxane monomer and the alkylene diamine is too low (for example, lower than 0.1 mol %), adhesion cannot occur between the first polyimide layer and the second polyimide layer.

According to an embodiment of the present disclosure, at least one of the first polyimide layer and the second polyimide layer has a glass transition temperature ranging from 260 to 340° C., preferably from 265 to 320° C., and more preferably from 270 to 300° C.

According to an embodiment of the present disclosure, the first polyimide layer and the second polyimide layer are each a thermosetting polyimide layer, and have a glass transition temperature ranging from 260 to 340° C., preferably from 265 to 320° C., and more preferably from 270 to 300° C.

In a preferred specific embodiment of the present disclosure, the first polyimide layer and the first metal foil, and the second polyimide layer and the second metal foil have a close or substantially the same coefficient of thermal expansion. Preferably, the first polyimide layer and the second polyimide layer each have a coefficient of thermal expansion ranging from 15 to 25 ppm/° C. The coefficient of thermal expansion of the first polyimide layer and the second polyimide layer may be adjusted, depending on the species of metal foil. The coefficient of thermal expansion of the first polyimide layer and the second polyimide layer may be adjusted to approach the coefficient of thermal expansion of the first metal foil and the second metal foil. For example, when the metal foil is a copper foil, the first polyimide layer and the second polyimide layer preferably each have a coefficient of thermal expansion ranging from 15 to 19 ppm/° C. Because the first polyimide layer and the second polyimide layer have a coefficient of thermal expansion close to that of the first metal foil and that of the second metal foil, warpage is reduced, thus increasing flatness of the metal clad laminate.

Furthermore, according to an embodiment of the present disclosure, the polyimide of the present disclosure may optionally comprise a nitrogen-containing heterocyclic group, for example, but not limited to, imidazolyl, pyridyl, or triazolyl, and preferably triazolyl. Such polyimide may be prepared by incorporating the nitrogen-containing heterocyclic group into the dianhydride monomer or the diamine monomer, or by attaching the nitrogen-containing heterocyclic group to the polymer chain (for example, through plasma grafting) after the polyamic acid or polyimide is prepared. The nitrogen-containing heterocyclic group may be complexed with the metal foil (e.g. copper), thereby increasing the adhesion strength between the metal foil and the polyimide.

The metal clad laminate of the present disclosure is equivalent to a double-sided flexible metal foil (e.g. copper foil) laminate in structure, is superior to a single-sided flexible copper foil laminate in terms of mechanical properties, and can be used for circuit fabrication simultaneously on both sides. In contrast to the existing double-sided flexible copper foil laminate, in the present disclosure, the peeling strength between the first polyimide layer and the second polyimide layer can be controlled by adjusting the lamination temperature and/or pressure during preparation of the metal clad laminate, to prepare a quasi double-sided two-layer metal clad laminate or a double-sided two-layer metal clad laminate.

In a first specific embodiment of the present disclosure, the peeling strength between the first polyimide layer and the second polyimide layer in the quasi double-sided two-layer metal clad laminate ranges from 1 to 500 gf/cm, and preferably from 3 to about 100 gf/cm. More preferably, the peeling strength ranges from 5 to about 50 gf/cm to avoid the tendency for warpage upon separation due to the high adhesion between the first polyimide layer and the second polyimide layer. In this embodiment, the quasi double-sided two-layer metal clad laminate can be used for circuit fabrication on both sides of the metal clad laminate, to prepare two separate flexible printed circuit boards. The first polyimide layer and the second polyimide layer have a suitable peeling strength at the interface therebetween, and accordingly may be separated from each other at the interface after the fabrication of the component is complete, to obtain two flexible printed circuit boards at the same time. The flexible printed circuit board prepared with the metal clad laminate of the present disclosure has a structure equivalent to that of the flexible printed circuit board prepared with a single-sided FCCL, is light and thin and has good flexibility. However, compared with the process using single-sided FCCL, two flexible printed circuit boards can be prepared at the same time in a single process by using the quasi double-sided two-layer metal clad laminate according to the present disclosure. As such, productivity can be raised and process time can be reduced. In addition, the common single-sided FCCLs tend to warp. Therefore, during printing of a circuit, a photoresist is applied not only to the surface of the copper foil for circuit fabrication, but also to the surface of the polyimide layer, such that structural balance is achieved on two opposite sides of the FCCL, thereby alleviating the occurrence of warpage. The photoresist is removed in a subsequent step. However, this increases the fabrication cost. The quasi double-sided two-layer metal clad laminate of the present disclosure has a symmetric structure per se and can be used for circuit fabrication simultaneously on both sides. Therefore, compared with a common single-sided FCCL, the metal clad laminate of the present disclosure is not prone to warp, and can be used in an expeditious and economical manner to fabricate a flexible printed circuit board.

In a second specific embodiment of the present disclosure, the peeling strength between the first polyimide layer and the second polyimide layer in the double-sided two-layer metal clad laminate is greater than 500 gf/cm, preferably greater than 800 gf/cm, and more preferably greater than 1000 gf/cm. In this embodiment, the peeling strength is substantial and the adhesion is good at the interface between the first polyimide layer and the second polyimide layer. Therefore, the double-sided metal clad laminate is useful in the fabrication of a double-side wired flexible printed circuit board.

The present disclosure further provides a method for preparing the metal clad laminate. The method according to the present disclosure comprises:

(a) providing a first metal film comprising a first metal foil and a first polyimide layer directly disposed on the first metal foil;

(b) providing a second metal film comprising a second metal foil and a second polyimide layer directly disposed on the second metal foil; and (c) superposing the first polyimide layer of the first metal film onto the second polyimide layer of the second metal film and laminating, wherein the first metal foil and the second metal foil each have a coefficient of thermal expansion ranging from 15 to 25 ppm/° C.

The materials and properties of the first metal foil, the second metal foil, the first polyimide layer and the second polyimide layer are as described herein above.

In steps (a) and (b), the first metal film and the second metal film are each a flexible two-layer metal film without adhesive. The method for preparing the first metal film and the second metal film is not particularly limited, and may be for example sputtering/plating, casting or hot lamination. For example: 1. in the sputtering/plating process, a layer of metal film (approximately below 1 μm) is deposited by sputtering onto a polyimide film in high vacuum environment, the surface is roughened by lithographic etching, and then the metal layer is increased to a desired thickness by electroplating. 2. In the casting process, a thin layer of thermoplastic polyimide precursor is applied onto a metal foil which is used as a carrier; and after drying, a second layer, which is thicker, of polyimide precursor (generally a thermosetting polyimide precursor) is applied thereon so as to enhance the rigidity of the laminate, and a flexible two-layer laminate is formed after high-temperature cyclization. 3. In the hot lamination process, a thin layer of thermoplastic polyimide precursor is applied onto a polyimide film which is used as a carrier; after high-temperature cyclization, the metal foil is disposed on the thermoplastic polyimide, and the thermoplastic polyimide is melted again and laminated to the metal foil under a nitrogen atmosphere by heated rollers under appropriate lamination pressure, to form a two-layer flexible laminate. The casting process is preferred.

According to an embodiment of the present disclosure, an aromatic diamine monomer, a diaminosiloxane monomer and an alkylene diamine may first react with an aromatic dianhydride to prepare a polyamic acid solution (for example, but not limited to, at 0 to 80° C. for 1 to 48 hrs). Then the polyamic acid solution is applied onto a metal foil (to a thickness of, for example, but not limited thereto, about 2 to 180 μm), pre-heated to remove the solvent (for example, but not limited to, at 50 to 200° C. for 1 to 20 min), and then further heated, to allow the polyamic acid to dehydrate and cyclize into a polyimide (for example, but not limited to, at 250 to 350° C. for 30 to 180 min).

According to another embodiment of the present disclosure, a glass or plastic may be used as a carrier, and a polyimide precursor or a polyimide precursor composition may be coated onto the carrier, to form a semi-finished product comprising the carrier and a resin layer. The semi-finished product is dried by heating to remove the solvent, thus forming a product comprising the carrier and the resin layer. A metal foil layer is formed on the surface of the resin layer of the product by sputtering/plating or hot lamination as described above, and then a two-layer flexible laminate is prepared by carrying out a further heat treatment after the removal of the glass or plastic carrier. The plastic carrier is preferably polyethylene terephthalate, polymethyl methyacrylate, polycyclic olefins, cellulose triacetate or a mixture thereof. The solvent removed by heating is the one added for dissolving the monomers or for other purposes during the preparation of the polyimide precursor of the present disclosure. The solvent used in the present disclosure is not particularly limited and may comprise or be selected from the following groups: dimethyl sulfoxide (DMSO), diethyl sulfoxide, N,N-dimethyl-methanamide (DMF), N,N-diethyl-methanamide, N,N-dimethylacetamide (DMAc), N,N-diethylacetamide, N-methyl-2-pyrrolidone (NMP), N-ethyl- 2-pyrrolidone (NEP), phenol, o-cresol, m-cresol, p-cresol, xylenol, halogenated phenol, pyrocatechol, tetrahydrofuran (THF), dioxane, dioxolane, propylene glycol monomethyl ether (PGME), tetraethylene glycol dimethyl ether (TGDE), methanol, ethanol, butanol, 2-butoxyethanol, γ-butyrolactone (GBL), xylene, toluene, hexamethylphosphoramide, propylene glycol monomethyl ether acetate (PGMEA) and a mixture thereof. The solvent is preferably a polar aprotic solvent, for example, a solvent selected from the following groups: dimethyl sulfoxide (DMSO), diethyl sulfoxide, N,N-dimethyl-methanamide (DMF), N,N-diethyl-methanamide, N,N-dimethylacetamide (DMAc), N,N-diethylacetamide, N-methyl-2-pyrrolidone (NMP), N-ethyl-2-pyrrolidone (NEP), γ-butyrolactone (GBL).

In step (c), no adhesive exists between the first polyimide layer and the second polyimide layer. Step (c) can be carried by any method, preferably by a roll-to-roll method in which the first polyimide layer of the first metal film faces the second polyimide layer of the second metal film and then is laminated thereon. In step (c), the lamination may be carried out in any way, for example, but not limited thereto, roller lamination, hot press, vacuum lamination, or vacuum press, and preferably roller lamination. If necessary, a protective film may be applied to and laminated together with the metal film (as protective film/first metal film or second metal film/protective film). The type of protective film is not particularly limited; for example, NPI available from KANEKA Corporation may be used as a protective film.

The polyimide layer used in step (c) is prepared by subjecting the dianhydride monomer and the diamine monomer to ring-opening polymerization to produce a polyamic acid, which is then imidized and dehydrated to form a polyimide. The resulting polyimide has a highly symmetric structure, a glass transition temperature ranging from 260 to 340° C., and excellent thermal stability, as well as a coefficient of thermal expansion close to that of the metal foil, thus avoiding warpage.

Moreover, at least one of the first polyimide layer and the second polyimide layer in the present disclosure comprises a polymeric unit derived from a diaminosiloxane or an alkylene diamine or a combination thereof, and preferably both the first polyimide layer and the second polyimide layer comprise a polymeric unit derived from a diaminosiloxane or an alkylene diamine or a combination thereof, such that adhesion occurs generates after the lamination of the first polyimide layer and the second polyimide layer. For example, the first polyimide layer may be superposed onto the second polyimide layer, and then laminated in a roller press at an elevated temperature under an elevated pressure, thereby increasing the adhesion strength. The temperature and pressure described above depend on the desired peeling strength between the first polyimide layer and the second polyimide layer.

The lamination in step (c) is preferably carried out at a temperature greater than the glass transition temperature of the first polyimide layer and the second polyimide layer. The lamination temperature and pressure may be adjusted depending on the product to be produced. It is found by the present inventors through repeated experiments and research that the quasi double-sided two-layer metal clad laminate or double-sided two-layer metal clad laminate may be prepared by taking into consideration the lamination temperature and pressure in combination with the glass transition temperature of the first polyimide layer and the second polyimide layer.

According to a specific embodiment of the present disclosure, to avoid warpage, the lamination is performed by roller lamination at a high temperature under a low pressure. The glass transition temperature of the first polyimide layer and the second polyimide layer is in the range of 260 to 340° C., so the lamination temperature is controlled to 300-390° C., and the lamination line pressure is controlled to 1 to 60 kgf/cm, preferably to 5 to 50 kgf/cm. The resulting metal clad laminate is a quasi double-sided two-layer metal clad laminate, and the peeling strength at the interface between the first polyimide layer and the second polyimide layer is from 1 to 500 gf/cm. According to a specific embodiment of the present disclosure, the quasi double-sided two-layer metal clad laminate may have a peeling strength of 3, 5, 6, 7, 8, 10, 15, 30, 45, 60, 75, 90, 100, 130, 150, 200, 300, 400 or 500 gf/cm. According to a preferred embodiment of the present disclosure, the first polyimide layer and the second polyimide layer are laminated by roller lamination using a roller press at a lamination temperature that is preferably in the range of 310 to 370° C., and under a lamination line pressure that is preferably in the range of 10 to 45 kgf/cm. The resulting metal clad laminate is a quasi double-sided two-layer metal clad laminate, and the peeling strength at the interface between the first polyimide layer and the second polyimide layer is preferably from 3 to 100 gf/cm, and more preferably from 5 to 50 gf/cm. For the quasi double-sided two-layer metal clad laminate formed under the above lamination conditions, appropriate adhesion exists between the first polyimide layer and the second polyimide layer. Therefore, the quasi double-sided two-layer metal clad laminate can be used for fabrication of a flexible circuit board through a relevant process for preparing such. After the flexible circuit board is prepared, two single-sided flexible circuit boards can be easily obtained by separating the first polyimide layer from the second polyimide layer. The above-mentioned line pressure refers to a force for lamination applied by two rollers in a roller heat press machine onto a substrate with a constant width divided by the width of the substrate.

According to another specific embodiment of the present disclosure, the glass transition temperature of the first polyimide layer and the second polyimide layer is in the range of 260 to 340° C. By adjusting the lamination temperature and pressure, a double-sided two-layer metal clad laminate can also be prepared in the present disclosure. For example, the lamination may be performed by roller lamination at a lamination temperature in the range of 350 to 400° C. and under a lamination line pressure in the range of 100 to 200 kgf/cm, such that a peeling strength greater than 500 gf/cm, preferably greater than 800 gf/cm, and more preferably greater than 1000 gf/cm, is produced at the interface between the first polyimide layer and the second polyimide layer, and the first polyimide layer and the second polyimide layer can be effectively adhered together without separation from each other.

To prevent warpage during the process for preparing a single-sided flexible circuit board, a dry film photoresist is generally attached to both an upper and a lower surface of the single-sided copper clad laminate. However, this causes the waste of photoresist. In addition, to save time in processing, some manufacturers use an adhesive tape to adhere the polyimide layers of two single-sided copper clad laminates together, and separate them after the fabrication of circuits on both sides. However, attachment by an adhesive tape is generally applicable only to a sheet by sheet process, and encounters difficulty when applied to a roll to roll process, and therefore, it is unable to continuously and rapidly produce the products by the roll to roll process in this case. Moreover, because such adhesive tapes are mostly epoxy resins or acrylates without high temperature resistance and having poor chemical resistance, and the fabrication of printed circuit boards generally involves acidic electroplating, acidic etching and alkaline development, gold plating, electroless nickel immersion gold (ENIG) and other processes, the adhesive tapes generally need to be removed upon failure (for example, after etching) and a new adhesive tape is required for reattachment such that subsequent processes can be carried out. Such fabrication process is complicated and may result in adhesive residue. The method for preparing the metal clad laminate according to the present disclosure has none of the above disadvantages, and is more suitable for use in a roll to roll process. Furthermore, during the preparation of a double-sided flexible circuit board in the prior art, due to the poor adhesion (generally, the peeling strength is about <1 gf/cm) between the thermosetting polyimide layers, a thermoplastic polyimide is commonly used to provide adhesion to the thermosetting polyimide layers. For example, ROC (Taiwan) Patent Application No. 200709751A discloses bonding of two polyimide layers with a thermoplastic polyimide, which however increases the complexity of the process. Moreover, in general, the glass transition temperature of a thermoplastic polyimide can be lowered by introducing a flexible group (e.g. C=O, —O—, and —S—) to reduce the rigidity of the backbone, a monomer having an asymmetrically structure to reduce the symmetry of the polymer, or a monomer having a non-planar structure to reduce the co-planar structure of the polymer, or by reducing its regularity. Generally, a thermoplastic polyimide has a lower glass transition temperature (Tg) (about 170 to 250° C.) and higher thermal expansion coefficient (about 40 to 90 ppm/° C.), and is prone to cause warpage of the laminate. Moreover, the low glass transition temperature of the thermoplastic polyimide is adverse to the heat resistance of the double-sided laminate.

Accordingly, in the method according to the present disclosure, a quasi double-sided two-layer metal clad laminate may be prepared by appropriately adjusting the lamination temperature and pressure, and easily separated into two single-sided flexible circuit boards after the fabrication of flexible printed circuits on both sides of the quasi double-sided two-layer metal clad laminate. This eliminates the disadvantage currently existing in the industry that a dry film photoresist is required to be attached to both an upper and a lower surface of a single-sided copper clad laminate or an adhesive tape is used in the preparation of a single-sided flexible circuit board, and thus results in the advantages of a simplified process and reduced cost. Also, in the present disclosure, the lamination temperature and pressure may be appropriately adjusted to prepare a double-sided two-layer metal clad laminate, so as to eliminate the disadvantage existing in the industry of use of a thermoplastic polyimide in the preparation of a double-sided metal clad laminate. This lowers production costs while simultaneously enhancing the heat resistance of the laminate.

The metal clad laminate of the present disclosure is useful in the preparation of a single-sided or double-sided flexible circuit board. In the present disclosure, because the metal clad laminate is free of adhesive or has no thermoplastic polyimide layer for adhesion between the metal foil and the polyimide layer, a light and thin flexible circuit board can be fabricated. In addition, warpage is reduced due to the close coefficients of thermal expansion of the polyimide layer and the metal foil.

Therefore, the present disclosure further provides a method for preparing a single-sided flexible circuit board by using the quasi double-sided two-layer metal clad laminate, which further comprises the steps of:

(d) forming at least one circuit unit respectively on the surface of the first metal foil and the second metal foil of the metal clad laminate; and (e) separating the first polyimide layer from the second polyimide layer, to form two single-sided flexible circuit boards.

It should be understood by those of skill in the art that the surface of the first metal foil on which the circuit unit is formed in step (d) refers to a surface of the first metal foil opposing the surface of the first metal foil adhered to the first polyimide layer, and the surface of the second metal foil on which the circuit unit is formed refers to a surface of the second metal foil opposing the surface of the second metal foil adhered to the second polyimide layer.

Figure 2:
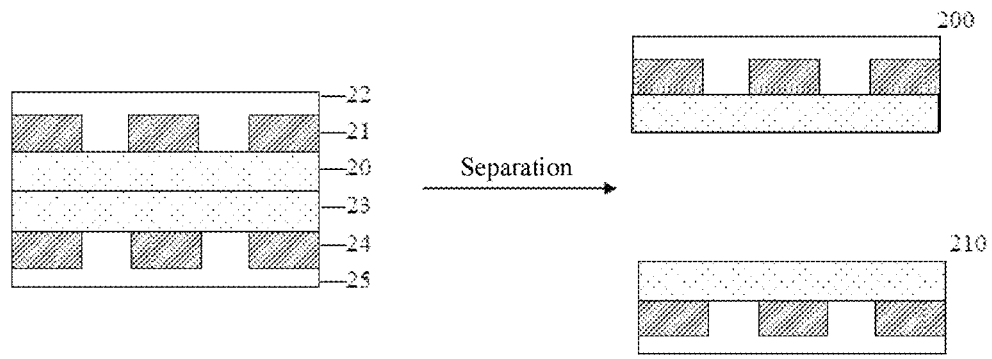
FIG. 2 is a schematic view showing the preparation of two single-side wired flexible circuit boards by using a metal clad laminate according to the present disclosure.

The method for forming the circuit unit in step (d) is not particularly limited, and may be any suitable method known to those skilled in the art. For example, as shown in FIG. 2 (which is a schematic view showing the preparation of two single-side wired flexible circuit boards by using the metal clad laminate according to the present disclosure), each of the first metal foil 21 on the first polyimide layer 20 and the second metal foil 24 on the second polyimide layer 23 may be patterned by the steps including exposure, development, etching and photoresist removal, to prepare an individual circuit unit. Then, a coverlay 22 and 25 may be optionally applied to the patterned first metal foil 21 and/or second metal foil 24 to protect the circuit unit, and an ENIG process (not shown in the figure) may also be carried out as desired. Subsequently, in step (e), two single-side wired flexible circuit boards 200 and 210 are formed by separation at the interface between the first polyimide layer 20 and the second polyimide layer 23 (see FIG. 2).

Figure 3:
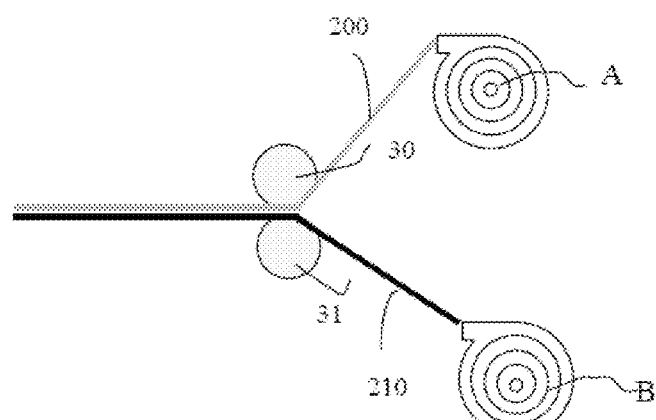
FIG. 3 is a schematic view showing the separation of two single-side wired flexible circuit boards according to the present disclosure.

Due to the presence of an appropriate but not overly high peeling strength (ranging from 1 to 500 gf/cm) at the interface between the first polyimide layer and the second polyimide layer, in step (e), two single-sided flexible circuit boards 200 and 210 are debonded by a roll-to-roll process at the interface with the aid of rollers 30 and 31, and wound into rolls A and B of single-sided flexible circuit board (see FIG. 3, a schematic view showing the separation of two single-sided wired flexible circuit boards according to the present disclosure).

It should be understood by those skilled in the art that due to the presence of metal foils on both sides, the metal clad laminate of the present disclosure is useful not only in the preparation of a single-sided flexible circuit board, but also in the preparation of a double-sided flexible circuit board, especially when the first polyimide layer and the second polyimide layer have a peeling strength that is greater than 500 gf/cm at the interface therebetween.

Therefore, the present disclosure further provides a method for preparing a double-sided flexible circuit board by using the double-sided two-layer metal clad laminate, which further comprises the steps of:

(f) forming at least one circuit unit respectively on the surface of the first metal foil and the second metal foil of the metal clad laminate.

The method for forming the circuit unit in step (0 is as described in step (d). The wires formed on the upper and lower sides can electrically connect to each other using any suitable method known to those skilled in the art, for example, but not limited thereto, by etching the exposed first polyimide layer and second polyimide layer after step (d) to form a via hole, sputtering a seed layer in the via hole and then plating a conductive component.

Considering this, the metal clad laminate of the present disclosure not only has the advantages of a single-sided laminate, i.e., being light and thin, and but also has the advantages of a double-sided laminate, i.e., being useful for circuit fabrication simultaneously on both sides. In addition, the metal clad laminate of the present disclosure is applicable to the preparation of either a single-sided flexible circuit board or a double-sided flexible circuit board, thus having a broader range of applications compared with the existing single-sided FCCLs or double-sided FCCLs. Moreover, the metal clad laminate of the present disclosure is simple to prepare and low in cost, thus having economic advantages.

Preferred embodiments of the present disclosure are disclosed as above, which, however, are provided for further illustrating instead of limiting the scope of the present disclosure. Any modifications and variations easily made by those of skill in the art are contemplated within the disclosure of the specification and the scope of the appended claims of the present disclosure.

EXAMPLES

The abbreviations mentioned in examples below are defined as follows:

PAN-H:

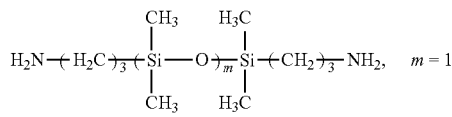

PAN-P:

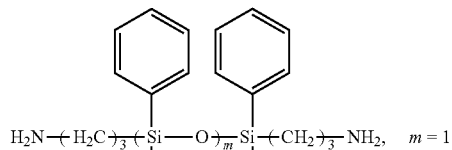

HDA:

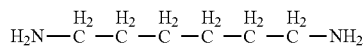

Preparation Example 1

218.12 g (1 mol) of pyromellitic dianhydride (PMDA) was dissolved in 1291 g of NMP, heated to 50° C. and reacted for 2 hrs with stirring. 11.62 g (0.1 mol) of 2-hydroxyethyl acrylate (HEA) was slowly added dropwise, and reacted for 2 hrs at 50° C. with stirring. Then, 199.24 g (0.995 mol) of ODA and 1.24 g (0.005 mol) of PAN-H were added to the solution, and reacted for 6 hrs at 50° C. with stirring after complete dissolution, to obtain a polyimide precursor resin PAA-1 with a solid content of 25%. PAN-H accounted for about 0.5 mol % of the total moles of the diamine monomers.

Preparation Example 2

218.12 g (1 mol) of PMDA was dissolved in 1293 g of NMP, heated to 50° C. and reacted for 2 hrs with stirring. 11.62 g (0.1 mol) of HEA was slowly added dropwise, and reacted for 2 hrs at 50° C. with stirring. Then, 196.24 g (0.98 mol) of ODA and 4.97 g (0.02 mol) of PAN-H were added to the solution, and reacted for 6 hrs at 50° C. with stirring after complete dissolution, to obtain a polyimide precursor resin PAA-2 with a solid content of 25%. PAN-H accounted for about 2 mol % of the total moles of the diamine monomer.

Preparation Example 3

218.12 g (1 mol) of PMDA was dissolved in 1297 g of N-methyl-2-pyrrolidone (NMP), heated to 50° C. and reacted for 2 hrs with stirring. 11.62 g (0.1 mol) of HEA was slowly added dropwise, and reacted for 2 hrs at 50° C. with stirring. Then, 190.43 g (0.951 mol) of 4,4'-oxydianiline (ODA) and 12.18 g (0.049 mol) of PAN-H were added to the solution, and reacted for 6 hrs at 50° C. with stirring after complete dissolution, to obtain a polyimide precursor resin PAA-3 with a solid content of 25%. PAN-H accounted for about 4.9 mol % of the total moles of the diamine monomer.

Preparation Example 4

218.12 g (1 mol) of PMDA was dissolved in 1300 g of NMP, heated to 50° C. and reacted for 2 hrs with stirring. 11.62 g (0.1 mol) of HEA was slowly added dropwise, and reacted for 2 hrs at 50° C. with stirring. Then, 186.22 g (0.93 mol) of ODA and 17.40 g (0.07 mol) of PAN-H were added to the solution, and reacted for 6 hrs at 50° C. with stirring after complete dissolution, to obtain a polyimide precursor resin PAA-4 with a solid content of 25%. PAN-H accounted for about 7 mol % of the total moles of the diamine monomer.

Preparation Example 5

218.12 g (1 mol) of PMDA was dissolved in 1304 g of NMP, heated to 50° C. and reacted for 2 hrs with stirring. 11.62 g (0.1 mol) of HEA was slowly added dropwise, and reacted for 2 hrs at 50° C. with stirring. Then, 180.22 g (0.9 mol) of ODA and 24.85 g (0.1 mol) of PAN-H were added to the solution, and reacted for 6 hrs at 50° C. with stirring after complete dissolution, to obtain a polyimide precursor resin PAA-5 with a solid content of 25%. PAN-H accounted for about 10 mol % of the total moles of the diamine monomer.

Preparation Example 6

218.12 g (1 mol) of PMDA was dissolved in 1334 g of NMP, heated to 50° C. and reacted for 2 hrs with stirring. 11.62 g (0.1 mol) of HEA was slowly added dropwise, and reacted for 2 hrs at 50° C. with stirring. Then, 190.43 g (0.951 mol) of ODA and 24.34 g (0.049 mol) of PAN-P were added to the solution, and reacted for 6 hrs at 50° C. with stirring after complete dissolution, to obtain a polyimide precursor resin PAA-6 with a solid content of 25%. PAN-P accounted for about 4.9 mol % of the total moles of the diamine monomer.

Preparation Example 7

218.12 g (1 mol) of PMDA was dissolved in 1290 g of NMP, heated to 50° C. and reacted for 2 hrs with stirring. 11.62 g (0.1 mol) of HEA was slowly added dropwise, and reacted for 2 hrs at 50° C. with stirring. Then, 200.24 g (1 mol) of ODA was added to the solution, and reacted for 6 hrs at 50° C. with stirring after complete dissolution, to obtain a polyimide precursor resin PAA-7 with a solid content of 25%. PAN-H accounted for about 0 mol % of the total moles of the diamine monomer.

Preparation Example 8

218.12 g (1 mol) of PMDA was dissolved in 1307 g of NMP, heated to 50° C. and reacted for 2 hrs with stirring. 11.62 g (0.1 mol) of HEA was slowly added dropwise, and reacted for 2 hrs at 50° C. with stirring. Then, 176.21 g (0.88 mol) of ODA and 29.82 g (0.12 mol) of PAN-H were added to the solution, and reacted for 6 hrs at 50° C. with stirring after complete dissolution, to obtain a polyimide precursor resin PAA-8 with a solid content of 25%. PAN-H accounted for about 12 mol % of the total moles of the diamine monomer.

Preparation Example B1

294.22 g (1 mol) of 3,3',4,4'-biphenyltetracarboxylic dianhydride (BPDA) was dissolved in 1298 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of p-phenylene diamine (PPDA), 39.05 g (0.195 mol) of ODA, and 1.24 g (0.005 mol) of PAN-H were added to the solution, and reacted for 6 hrs at 50° C. with stirring after complete dissolution, to obtain a polyimide precursor resin PAA-B1 with a solid content of 25%. PAN-H accounted for about 0.5 mol % of the total moles of the diamine monomer.

Preparation Example B2

294.22 g (1 mol) of BPDA was dissolved in 1300 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 36.04 g (0.18 mol) of ODA, and 4.97 g (0.02 mol) of PAN-H were added to the solution, and reacted for 6 hrs at 50° C. with stirring after complete dissolution, to obtain a polyimide precursor resin PAA-B2 with a solid content of 25%. PAN-H accounted for about 2 mol % of the total moles of the diamine monomer.

Preparation Example B3

294.22 g (1 mol) of BPDA was dissolved in 1304 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 30.24 g (0.151 mol) of ODA, and 12.18 g (0.049 mol) of PAN-H were added to the solution, and reacted for 6 hrs at 50° C. with stirring after complete dissolution, to obtain a polyimide precursor resin PAA-B3 with a solid content of 25%. PAN-H accounted for about 4.9 mol % of the total moles of the diamine monomer.

Preparation Example B4

294.22 g (1 mol) of BPDA was dissolved in 1307 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 26.03 g (0.13 mol) of ODA, and 17.40 g (0.07 mol) of PAN-H were added to the solution, and reacted for 6 hrs at 50° C. with stirring after complete dissolution, to obtain a polyimide precursor resin PAA-B4 with a solid content of 25%. PAN-H accounted for about 7 mol % of the total moles of the diamine monomer Preparation Example B5

294.22 g (1 mol) of BPDA was dissolved in 1312 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 20.02 g (0.1 mol) of ODA, and 24.85 g (0.1 mol) of PAN-H were added to the solution, and reacted for 6 hrs at 50° C. with stirring after complete dissolution, to obtain a polyimide precursor resin PAA-B5 with a solid content of 25%. PAN-H accounted for about 10 mol % of the total moles of the diamine monomer.

Preparation Example B6

294.22 g (1 mol) of BPDA was dissolved in 1341 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 30.24 g (0.151 mol) of ODA, and 24.34 g (0.049 mol) of PAN-P were added to the solution, and reacted for 6 hrs at 50° C. with stirring after complete dissolution, to obtain a polyimide precursor resin PAA-B6 with a solid content of 25%. PAN-P accounted for about 4.9 mol % of the total moles of the diamine monomer.

Preparation Example B7

294.22 g (1 mol) of BPDA was dissolved in 1297 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, and 40.05 g (0.2 mol) of ODA were added to the solution, and reacted for 6 hrs at 50° C. with stirring after complete dissolution, to obtain a polyimide precursor resin PAA-B7 with a solid content of 25%. PAN-H accounted for about 0 mol % of the total moles of the diamine monomer.

Preparation Example B8

294.22 g (1 mol) of BPDA was dissolved in 1315 g of NMP, heated to 50° C. and reacted for 2 hrs with stirring. 11.62 g (0.1 mol) of HEA was slowly added dropwise, and reacted for 2 hrs at 50° C. with stirring. Then, 86.51 g (0.8 mol) of PPDA, 16.02 g (0.08 mol) of ODA, and 29.82 g (0.12 mol) of PAN-H were added to the solution, and reacted for 6 hrs at 50° C. with stirring after complete dissolution, to obtain a polyimide precursor resin PAA-B8 with a solid content of 25%. PAN-H accounted for about 12 mol % of the total moles of the diamine monomer.

Preparation Example D1

218.12 g (1 mol) of PMDA was dissolved in 1297 g of NMP, heated to 50° C. and reacted for 2 hrs with stirring. 11.62 g (0.1 mol) of HEA was slowly added dropwise, and reacted for 2 hrs at 50° C. with stirring. Then, 190.43 g (0.951 mol) of ODA and 2.9 g (0.025 mol) of HDA were added to the solution, and reacted for 6 hrs at 50° C. with stirring after complete dissolution, to obtain a polyimide precursor resin PAA-D1 with a solid content of 25% and a viscosity of 8,215 cP. HDA accounted for about 2.5 mol % of the total moles of the diamine monomer.

Preparation Example D2

218.12 g (1 mol) of PMDA was dissolved in 1297 g of NMP, heated to 50° C. and reacted for 2 hrs with stirring. 11.62 g (0.1 mol) of HEA was slowly added dropwise, and reacted for 2 hrs at 50° C. with stirring. Then, 190.43 g (0.951 mol) of ODA and 5.78 g (0.049 mol) of HDA were added to the solution, and reacted for 6 hrs at 50° C. with stirring after complete dissolution, to obtain a polyimide precursor resin PAA-C2 with a solid content of 25% and a viscosity of 7,329 cP. HDA accounted for about 4.9 mol % of the total moles of the diamine monomer.

Preparation of Metal Clad Laminate

Example 1 (Quasi Double-Sided Two-Layer Metal Clad Laminate)

The polyimide precursor resin solution PAA-1 synthesized in Preparation Example 1 was evenly roll coated onto a copper foil (VLP copper foil, ⅓ oz (12 μm), provided by Changchun petrochemical company), heated at 120° C. for 5 min, and then heated for 120 min in a nitrogen oven at 350° C., to obtain a single-sided copper clad laminate with a polyimide coating. The polyimide coating is about 12 μm thick.

Two single-sided copper clad laminates fabricated as above were superposed with the polyimide layers as internal layers and the copper foils as external layers, then laminated by heated rollers under a line pressure of 20 kgf/cm at a lamination temperature of 380° C., and then cooled, to obtain a quasi double-sided two-layer metal clad laminate Cu—PI-1.

The above-mentioned line pressure refers to a force for lamination applied by two rollers in a roller heat press machine onto a substrate with a constant width divided by the width of the substrate and thus is the line pressure for lamination.

Example 2 (Double-Sided Two-Layer Metal Clad Laminate)

The process was the same as that in Example 1, except that the lamination conditions were changed to line pressure of 190 kgf/cm, and lamination temperature of 400° C. A metal clad laminate Cu—PI-2 was obtained after cooling.

Example 3 (Quasi Double-Sided Two-Layer Metal Clad Laminate)

The process was the same as that in Example 1, except that the polyimide precursor resin solution PAA-2 was used instead, and the lamination conditions were changed to line pressure of 20 kgf/cm, and lamination temperature of 360° C. A metal clad laminate Cu—PI-3 was obtained after cooling.

Example 4 (Double-Sided Two-Layer Metal Clad Laminate)

The process was the same as that in Example 1, except that the polyimide precursor resin solution PAA-2 was used instead, and the lamination conditions were changed to line pressure of 140 kgf/cm, and lamination temperature of 390° C. A metal clad laminate Cu—PI-4 was obtained after cooling.

Example 5 (Quasi Double-Sided Two-Layer Metal Clad Laminate)

The process was the same as that in Example 1, except that the polyimide precursor resin solution PAA-3 was used instead, and the lamination conditions were changed to line pressure of 20 kgf/cm, and lamination temperature of 360° C. A metal clad laminate Cu—PI-5 was obtained after cooling.

Example 6 (Quasi Double-Sided Two-Layer Metal Clad Laminate)

The process was the same as that in Example 1, except that the polyimide precursor resin solution PAA-3 was used instead, and the lamination conditions were changed to line pressure of 60 kgf/cm, and lamination temperature of 320° C. A metal clad laminate Cu—PI-6 was obtained after cooling.

Example 7 (Double-Sided Two-Layer Metal Clad Laminate)

The process was the same as that in Example 1, except that the polyimide precursor resin solution PAA-3 was used instead, and the lamination conditions were changed to line pressure of 190 kgf/cm, and lamination temperature of 350° C. A metal clad laminate Cu—PI-7 was obtained after cooling.

Example 8 (Double-Sided Two-Layer Metal Clad Laminate)

The process was the same as that in Example 1, except that the polyimide precursor resin solution PAA-3 was used instead, and the lamination conditions were changed to line pressure of 140 kgf/cm, and lamination temperature of 390° C. A metal clad laminate Cu—PI-8 was obtained after cooling.

Example 9 (Quasi Double-Sided Two-Layer Metal Clad Laminate)

The process was the same as that in Example 1, except that the polyimide precursor resin solution PAA-4 was used instead, and the lamination conditions were changed to line pressure of 20 kgf/cm, and lamination temperature of 340° C. A metal clad laminate Cu—PI-9 was obtained after cooling.

Example 10 (Double-Sided Two-Layer Metal Clad Laminate)

The process was the same as that in Example 1, except that the polyimide precursor resin solution PAA-4 was used instead, and the lamination conditions were changed to line pressure of 120 kgf/cm, and lamination temperature of 390° C. A metal clad laminate Cu—PI-10 was obtained after cooling.

Example 11 (Quasi Double-Sided Two-Layer Metal Clad Laminate)

The process was the same as that in Example 1, except that the polyimide precursor resin solution PAA-5 was used instead, and the lamination conditions were changed to line pressure of 20 kgf/cm, and lamination temperature of 330° C. A metal clad laminate Cu—PI-11 was obtained after cooling.

Example 12 (Double-Sided Two-Layer Metal Clad Laminate)

The process was the same as that in Example 1, except that the polyimide precursor resin solution PAA-5 was used instead, and the lamination conditions were changed to line pressure of 110 kgf/cm, and lamination temperature of 390° C. A metal clad laminate Cu—PI-12 was obtained after cooling.

Example 13 (Quasi Double-Sided Two-Layer Metal Clad Laminate)

The process was the same as that in Example 1, except that the polyimide precursor resin solution PAA-6 was used instead, and the lamination conditions were changed to line pressure of 20 kgf/cm, and lamination temperature of 370° C. A metal clad laminate Cu—PI-13 was obtained after cooling.

Example 14 (Quasi Double-Sided Two-Layer Metal Clad Laminate)

The process was the same as that in Example 1, except that the polyimide precursor resin solution PAA-6 was used instead, and the lamination conditions were changed to line pressure of 60 kgf/cm, and lamination temperature of 320° C. A metal clad laminate Cu—PI-14 was obtained after cooling.

Example 15 (Double-Sided Two-Layer Metal Clad Laminate)

The process was the same as that in Example 1, except that the polyimide precursor resin solution PAA-6 was used instead, and the lamination conditions were changed to line pressure of 140 kgf/cm, and lamination temperature of 390° C. A metal clad laminate Cu—PI-15 was obtained after cooling.

Comparative Example 16

The process was the same as that in Example 1, except that the polyimide precursor resin solution PAA-7 was used instead, and the lamination conditions were changed to line pressure of 140 kgf/cm, and lamination temperature of 390° C. A metal clad laminate Cu—PI-16 was obtained after cooling.

Comparative Example 17

The process was the same as that in Example 1, except that the polyimide precursor resin solution PAA-8 was used instead, and the lamination conditions were changed to line pressure of 20 kgf/cm, and lamination temperature of 330° C. A metal clad laminate Cu—PI-17 was obtained after cooling.

Comparative Example 18

The process was the same as that in Example 1, except that the polyimide precursor resin solution PAA-8 was used instead, and the lamination conditions were changed to line pressure of 110 kgf/cm, and lamination temperature of 390° C. A metal clad laminate Cu—PI-18 was obtained after cooling.

Example B1 (Quasi Double-Sided Two-Layer Metal Clad Laminate)

The process was the same as that in Example 1, except that the polyimide precursor resin solution PAA-B1 was used instead, and the lamination conditions were changed to line pressure of 20 kgf/cm, and lamination temperature of 380° C. A metal clad laminate Cu—PI-b1 was obtained after cooling.

Example B2 (Double-Sided Two-Layer Metal Clad Laminate)

The process was the same as that in Example 1, except that the polyimide precursor resin solution PAA-B1 was used instead, and the lamination conditions were changed to line pressure of 190 kgf/cm, and lamination temperature of 400° C. A metal clad laminate Cu—PI-b2 was obtained after cooling.

Example B3 (Quasi Double-Sided Two-Layer Metal Clad Laminate)

The process was the same as that in Example 1, except that the polyimide precursor resin solution PAA-B2 was used instead, and the lamination conditions were changed to line pressure of 20 kgf/cm, and lamination temperature of 370° C. A metal clad laminate Cu—PI-b3 was obtained after cooling.

Example B4 (Double-Sided Two-Layer Metal Clad Laminate)

The process was the same as that in Example 1, except that the polyimide precursor resin solution PAA-B2 was used instead, and the lamination conditions were changed to line pressure of 140 kgf/cm, and lamination temperature of 390° C. A metal clad laminate Cu—PI-b4 was obtained after cooling.

Example B5 (Quasi Double-Sided Two-Layer Metal Clad Laminate)

The process was the same as that in Example 1, except that the polyimide precursor resin solution PAA-B3 was used instead, and the lamination conditions were changed to line pressure of 20 kgf/cm, and lamination temperature of 370° C. A metal clad laminate Cu—PI-b5 was obtained after cooling.

Example B6 (Quasi Double-Sided Two-Layer Metal Clad Laminate)

The process was the same as that in Example 1, except that the polyimide precursor resin solution PAA-B3 was used instead, and the lamination conditions were changed to line pressure of 60 kgf/cm, and lamination temperature of 320° C. A metal clad laminate Cu—PI-b6 was obtained after cooling.

Example B7 (Double-Sided Two-Layer Metal Clad Laminate)

The process was the same as that in Example 1, except that the polyimide precursor resin solution PAA-B3 was used instead, and the lamination conditions were changed to line pressure of 190 kgf/cm, and lamination temperature of 350° C. A metal clad laminate Cu—PI-b7 was obtained after cooling.

Example B8 (Double-Sided Two-Layer Metal Clad Laminate)

The process was the same as that in Example 1, except that the polyimide precursor resin solution PAA-B3 was used instead, and the lamination conditions were changed to line pressure of 140 kgf/cm, and lamination temperature of 390° C. A metal clad laminate Cu—PI-b8 was obtained after cooling.

Example B9 (Quasi Double-Sided Two-Layer Metal Clad Laminate)

The process was the same as that in Example 1, except that the polyimide precursor resin solution PAA-B4 was used instead, and the lamination conditions were changed to line pressure of 20 kgf/cm, and lamination temperature of 340° C. A metal clad laminate Cu—PI-b9 was obtained after cooling.

Example B10 (Double-Sided Two-Layer Metal Clad Laminate)

The process was the same as that in Example 1, except that the polyimide precursor resin solution PAA-B4 was used instead, and the lamination conditions were changed to line pressure of 120 kgf/cm, and lamination temperature of 390° C. A metal clad laminate Cu—PI-b10 was obtained after cooling.

Example B11 (Quasi Double-Sided Two-Layer Metal Clad Laminate)

The process was the same as that in Example 1, except that the polyimide precursor resin solution PAA-B5 was used instead, and the lamination conditions were changed to line pressure of 20 kgf/cm, and lamination temperature of 330° C. A metal clad laminate Cu—PI-b11 was obtained after cooling.

Example B12 (Double-Sided Two-Layer Metal Clad Laminate)

The process was the same as that in Example 1, except that the polyimide precursor resin solution PAA-B5 was used instead, and the lamination conditions were changed to line pressure of 110 kgf/cm, and lamination temperature of 390° C. A metal clad laminate Cu—PI-b12 was obtained after cooling.

Example B13 (Quasi Double-Sided Two-Layer Metal Clad Laminate)

The process was the same as that in Example 1, except that the polyimide precursor resin solution PAA-B6 was used instead, and the lamination conditions were changed to line pressure of 20 kgf/cm, and lamination temperature of 370° C. A metal clad laminate Cu—PI-b13 was obtained after cooling.

Example B14 (Quasi Double-Sided Two-Layer Metal Clad Laminate)

The process was the same as that in Example 1, except that the polyimide precursor resin solution PAA-B6 was used instead, and the lamination conditions were changed to line pressure of 60 kgf/cm, and lamination temperature of 320° C. A metal clad laminate Cu—PI-b14 was obtained after cooling.

Example B15 (Double-Sided Two-Layer Metal Clad Laminate)

The process was the same as that in Example 1, except that the polyimide precursor resin solution PAA-B6 was used instead, and the lamination conditions were changed to line pressure of 140 kgf/cm, and lamination temperature of 390° C. A metal clad laminate Cu—PI-b15 was obtained after cooling.

Comparative Example B16

The process was the same as that in Example 1, except that the polyimide precursor resin solution PAA-B7 was used instead, and the lamination conditions were kept unchanged, i.e. line pressure of 140 kgf/cm, and lamination temperature of 390° C. A metal clad laminate Cu—PI-b16 was obtained after cooling.

Comparative Example B17

The process was the same as that in Example 1, except that the polyimide precursor resin solution PAA-B8 was used instead, and the lamination conditions were changed to line pressure of 20 kgf/cm, and lamination temperature of 330° C. A metal clad laminate Cu—PI-b17 was obtained after cooling.

Comparative Example B18

The process was the same as that in Example 1, except that the polyimide precursor resin solution PAA-B8 was used instead, and the lamination conditions were changed to line pressure of 110 kgf/cm, and lamination temperature of 390° C. A metal clad laminate Cu—PI-b18 was obtained after cooling.

Example D1 (Quasi Double-Sided Two-Layer Metal Clad Laminate)

The process was the same as that in Example 1, except that the polyimide precursor composition PAA-D1 was used instead, and the lamination conditions were changed to line pressure of 20 kgf/cm, and lamination temperature of 360° C. A metal clad laminate Cu—PI-d1 of the present disclosure was obtained after cooling.

Example D2 (Double-Sided Two-Layer Metal Clad Laminate)

The process was the same as that in Example 1, except that the polyimide precursor composition PAA-D1 was used instead, and the lamination conditions were changed to line pressure of 140 kgf/cm, and lamination temperature of 390° C. A metal clad laminate Cu—PI-d2 of the present disclosure was obtained after cooling.

Example D3 (Quasi Double-Sided Two-Layer Metal Clad Laminate)

The process was the same as that in Example 1, except that the polyimide precursor composition PAA-D2 was used instead, and the lamination conditions were changed to line pressure of 20 kgf/cm, and lamination temperature of 360° C. A metal clad laminate Cu—PI-d3 of the present disclosure was obtained after cooling.

Example D4 (Double-Sided Two-Layer Metal Clad Laminate)

The process was the same as that in Example 1, except that the polyimide precursor composition PAA-D2 was used instead, and the lamination conditions were changed to line pressure of 190 kgf/cm, and lamination temperature of 350° C. A metal clad laminate Cu—PI-d4 of the present disclosure was obtained after cooling.

<Test Methods of Metal Clad Laminate>

Measurement of Glass Transition Temperature (Tg) of Polyimide Layer:

A polyimide layer was removed from a single-sided metal clad laminate, and measured for Tg by using a thermal mechanical analyzer (TMA, TA Q400 from Texas Instruments). The measurement range was from 0 to 500° C., and the temperature ramping rate was 10° C./min.

Measurement of Coefficient of Thermal Expansion (CTE) of Polyimide Layer:

A polyimide layer was removed from a single-sided metal clad laminate, and measured for CTE by using a thermal mechanical analyzer (TMA, TA Q400 from Texas Instruments). The measurement range was from 0 to 500° C., and the temperature ramping rate was 10° C./min.

Measurement of Peeling Strength Between Two Polyimide Layers:

The laminates obtained in the above examples and comparative examples were cut into test strips of 15 cm×1 cm. The two polyimide layers at an end of the test strip were slightly separated, and clipped respectively in a clamping fixture of a micro-computer aided pulling force tester (HT-9102, Hung Ta Instrument Co., Ltd, maximum load: 100 kg). The peeling strength test was conducted by drawing at a vertical angle of 180 degrees between the two slightly separated polyimide layers with a distance of 1 cm from one to the other clamping fixture.

Measurement of Tensile Strength:

The tensile strength test is to measure the mechanical property of the polyimide film of the single-sided copper clad laminate of the examples and comparative examples before lamination with another single-sided copper clad laminate and after removing the copper foil by using a universal tensile strength tester according to the IPC-TM-650 (2.4.19) method. The test result is acceptable if the tensile strength is higher than 100 Mpa.

Flame Retardance Test:

The flame retardance test was carried out on the polyimide film according to the UL94 standard.

<Test Results>

Relevant test results for the above examples and comparative examples are shown in Tables 1-5:

TABLE 1

| | Example 1 | Example 2 | Example 3 | Example 4 | Example 5 | Example 6 | Example 7 | Example 8 | Example 9 |
|---|---|---|---|---|---|---|---|---|---|
| Precursor resin | PAA-1 | PAA-1 | PAA-2 | PAA-2 | PAA-3 | PAA-3 | PAA-3 | PAA-3 | PAA-4 |
| Lamination condition (° C.; kgf/cm) | 380° C. 20 kgf/cm | 400° C. 190 kgf/cm | 360° C. 20 kgf/cm | 390° C. 140 kgf/cm | 360° C. 20 kgf/cm | 320° C. 60 kgf/cm | 350° C. 190 kgf/cm | 390° C. 140 kgf/cm | 340° C. 20 kgf/cm |
| Tg (° C.) | 312 | 312 | 294 | 294 | 288 | 288 | 288 | 288 | 274 |
| CTE (ppm/° C.) | 17.2 | 17.2 | 17.5 | 17.5 | 18.3 | 18.3 | 18.3 | 18.3 | 18.8 |
| Peeling strength (gf/cm) | 3 | 532 | 22 | >1000 | 12 | 21 | >1000 | >1000 | 13 |
| Tensile strength (MPa) | 164 | 164 | 157 | 157 | 123 | 123 | 123 | 123 | 104 |
| Flame retardance test | V0 | V0 | V0 | V0 | V0 | V0 | V0 | V0 | V0 |

TABLE 2

| | Example 10 | Example 11 | Example 12 | Example 13 | Example 14 | Example 15 | Comparative Example 16 | Comparative Example 17 | Comparative Example 18 |
|---|---|---|---|---|---|---|---|---|---|
| Precursor resin | PAA-4 | PAA-5 | PAA-5 | PAA-6 (PAN-P) | PAA-6 (PAN-P) | PAA-6 (PAN-P) | PAA-7 | PAA-8 | PAA-8 |
| Lamination condition (° C.; kgf/cm) | 390° C. 120 kgf/cm | 330° C. 20 kgf/cm | 390° C. 110 kgf/cm | 370° C. 20 kgf/cm | 320° C. 60 kgf/cm | 390° C. 140 kgf/cm | 390° C. 140 kgf/cm | 330° C. 20 kgf/cm | 390° C. 110 kgf/cm |
| Tg (° C.) | 274 | 264 | 264 | 293 | 293 | 293 | 325 | 245 | 245 |
| CTE (ppm/° C.) | 18.8 | 19.2 | 19.2 | 17.9 | 17.9 | 17.9 | 17.1 | 20.1 | 20.1 |
| Peeling strength (gf/cm) | >1000 | 12 | >1000 | 9 | 16 | >1000 | 0 | 84 | >1000 |
| Tensile strength (MPa) | 104 | 93 | 93 | 121 | 121 | 121 | 178 | 81 | 81 |
| Flame retardance test | V0 | V0 | V0 | V0 | V0 | V0 | V0 | V1 | V1 |

TABLE 3

| | Example B1 | Example B2 | Example B3 | Example B4 | Example B5 | Example B6 | Example B7 | Example B8 | Example B9 |
|---|---|---|---|---|---|---|---|---|---|
| Precursor resin | PAA-B1 | PAA-B1 | PAA-B2 | PAA-B2 | PAA-B3 | PAA-B3 | PAA-B3 | PAA-B3 | PAA-B4 |
| Lamination condition (° C.; kgf/cm) | 380° C. 20 kgf/cm | 400° C. 190 kgf/cm | 370° C. 20 kgf/cm | 390° C. 140 kgf/cm | 370° C. 20 kgf/cm | 320° C. 60 kgf/cm | 350° C. 190 kgf/cm | 390° C. 140 kgf/cm | 340° C. 20 kgf/cm |
| Tg (° C.) | 317 | 317 | 298 | 298 | 292 | 292 | 292 | 292 | 281 |
| CTE (ppm/° C.) | 17.3 | 17.3 | 17.7 | 17.7 | 18.4 | 18.4 | 18.4 | 18.4 | 18.9 |
| Peeling strength (gf/cm) | 3 | 534 | 16 | >1000 | 8 | 31 | >1000 | >1000 | 11 |
| Tensile strength (MPa) | 198 | 198 | 178 | 178 | 149 | 149 | 149 | 149 | 112 |
| Flame retardance test | V0 | V0 | V0 | V0 | V0 | V0 | V0 | V0 | V0 |

TABLE 4

| | Example B10 | Example B11 | Example B12 | Example B13 | Example B14 | Example B15 | Comparative Example B16 | Comparative Example B17 | Comparative Example B18 |
|---|---|---|---|---|---|---|---|---|---|
| Precursor resin | PAA-B4 | PAA-B5 | PAA-B5 | PAA-B6 (PAN-P) | PAA-B6 (PAN-P) | PAA-B6 (PAN-P) | PAA-B7 | PAA-B8 | PAA-B8 |
| Lamination condition (° C.; kgf/cm) | 390° C. 120 kgf/cm | 330° C. 20 kgf/cm | 390° C. 110 kgf/cm | 370° C. 20 kgf/cm | 320° C. 60 kgf/cm | 390° C. 140 kgf/cm | 390° C. 140 kgf/cm | 330° C. 20 kgf/cm | 390° C. 110 kgf/cm |
| Tg (° C.) | 281 | 272 | 272 | 298 | 298 | 298 | 337 | 251 | 251 |
| CTE (ppm/° C.) | 18.9 | 19.4 | 19.4 | 17.6 | 17.6 | 17.6 | 16.7 | 19.9 | 19.9 |
| Peeling strength (gf/cm) | >1000 | 10 | >1000 | 7 | 13 | >1000 | 0 | 121 | >1000 |
| Tensile strength (MPa) | 112 | 102 | 102 | 146 | 146 | 146 | 205 | 89 | 89 |
| Flame retardance test | V0 | V0 | V0 | V0 | V0 | V0 | V0 | V1 | V1 |

TABLE 5

| | Example D1 | Example D2 | Example D3 | Example D4 |
|---|---|---|---|---|
| Precursor composition | PAA-D1 | PAA-D2 | PAA-D3 | PAA-D4 |
| Lamination condition (° C.; kgf/cm) | 360° C. 20 kgf/cm | 390° C. 140 kgf/cm | 360° C. 20 kgf/cm | 350° C. 190 kgf/cm |
| Tg (° C.) | 295 | 295 | 290 | 290 |
| CTE (ppm/° C.) | 17.7 | 17.7 | 18.5 | 18.5 |
| Peeling strength (gf/cm) | 21 | >1000 | 29 | >1000 |
| Tensile strength (MPa) | 144 | 144 | 115 | 115 |
| Flame retardance test | V0 | V0 | V0 | V0 |

The test results for Examples 1 to 15 and B1 to B15 show that a quasi double-sided two-layer metal clad laminate with an appropriate peeling strength or a double-sided two-layer metal clad laminate with a high peeling strength can be prepared by adjusting the lamination temperature and pressure. The results also show that the metal clad laminates obtained in Examples 1 to 15 and B1 to B15 have a coefficient of thermal expansion close to that of the copper foil, and exhibit satisfactory anti-warpage performance and tensile strength.

The addition of a diaminosiloxane monomer can reduce the glass transition temperature of the polyimide layer, as shown by the glass transition temperature of the polyimide layer obtained in Comparative Examples 16 and B16 (without diaminosiloxane monomer) and other examples and comparative examples (with 0.5 mol %, 2 mol %, 4.9 mol %, 7 mol %, 10 mol % and 12 mol % of diaminosiloxane monomer (based on the total moles of the diamine monomer), respectively).

The test results for Comparative Examples 17 and 18 and Comparative Examples B17 and B18 show that where 12 mol % of a diaminosiloxane monomer is used, the glass transition temperature is reduced to 245-251° C., the tensile strength is poor, and the flame retardance is poor as shown by failure to pass the UL94 V0 flammability test.

The test results for Comparative Examples 16 and B16 show that without the addition of diaminosiloxane monomer, the two polyimide layers cannot be effectively adhered together.

Examples D1 to D4 used an alkylene diamine monomer. The results show that a double-sided two-layer metal clad laminate with a high peeling strength or a quasi double-sided two-layer metal clad laminate with an appropriate peeling strength can be prepared by adjusting the lamination temperature and pressure. The resulting polyimide have a coefficient of thermal expansion close to that of the copper foil, and its anti-warpage performance and tensile strength can meet the requirements.

Finally, it should be noted that the above embodiments are intended to illustrate instead of limit the technical solution of the present disclosure. Although the present disclosure is described in detail by way of examples, it should be understood by those of ordinary skill in the art that modifications may be made to the technical solutions described in the embodiments, and equivalents may be substituted for some or all the technical features, without essentially departing from the scope of the technical solution described in the embodiments of the present disclosure.

What is claimed is:

1. A metal clad laminate, comprising:
a first metal foil;
a first polyimide layer directly disposed on the first metal foil;
a second metal foil; and
a second polyimide layer directly disposed on the second metal foil;
wherein the first polyimide layer is in contact with the second polyimide layer,
wherein the first polyimide layer and the second polyimide layer each have a coefficient of thermal expansion ranging from 15 to 25 ppm/° C., and
wherein the first polyimide layer and the second polyimide layer each comprises in its composition a polymeric unit derived from a diamine monomer, wherein the diamine monomer comprises a diaminosiloxane monomer, an alkylene diamine monomer or a combination thereof and wherein the total amount of the diaminosiloxane monomer and the alkylene diamine monomer is in the range from 2 to 10 mol %, based on the total moles of the diamine monomer, and
wherein a peeling strength between the first polyimide layer and the second polyimide layer is greater than 3 and less than 84 gf/cm.

2. The metal clad laminate according to claim 1, wherein the diaminosiloxane monomer has a general formula (III) below:

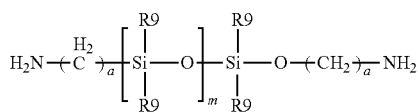

(III)

wherein each R9 is independently H, a linear or branched C1-C4 alkyl, or phenyl; a may be the same or different and is an integer ranging from 1 to 6; and m is an integer ranging from 1 to 15.

3. The metal clad laminate according to claim 2, wherein in formula (III), a is an integer ranging from 2 to 5.

4. The metal clad laminate according to claim 2, wherein in formula (III), m is an integer ranging from 1 to 5.

5. The metal clad laminate according to claim 2, wherein the diaminosiloxane monomer is selected from:

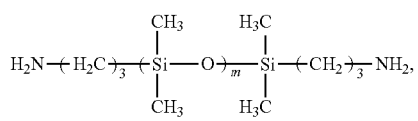

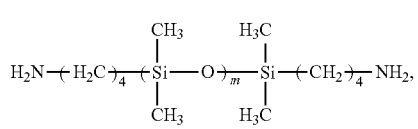

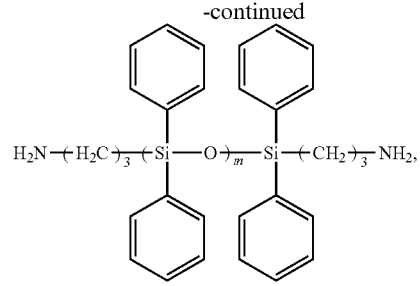

and a combination thereof,
wherein m is an integer ranging from 1 to 5.

6. The metal clad laminate according to claim 1, wherein the alkylene diamine monomer has a general formula (IV) below:

$$H_2N-R_2-NH_2 \quad (IV)$$

wherein each $R_2$ is $C_2$-$C_{14}$ alkylene.

7. The metal clad laminate according to claim 6, wherein the alkylene diamine monomer is selected from:

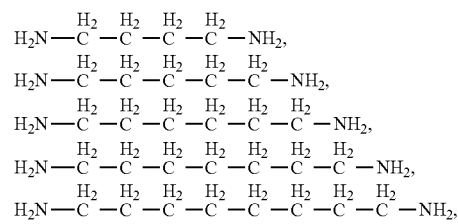

and a combination thereof.

8. The metal clad laminate according to claim 1, wherein the first polyimide layer and the second polyimide layer each have a glass transition temperature in the range of 260 to 340° C.

9. The metal clad laminate according to claim 1, wherein the first polyimide layer and the first metal foil, and the second polyimide layer and the second metal foil have a close coefficient of thermal expansion.

10. The metal clad laminate according to claim 1, wherein the total amount of the diaminosiloxane monomer and the alkylene diamine monomer is in the range from 2 to 7.5 mol %, based on the total moles of the diamine monomer.

11. The metal clad laminate according to claim 1, wherein the total amount of the diaminosiloxane monomer and the alkylene diamine is in the range from 2 to <5 mol %, based on the total moles of the diamine monomer.

12. The metal clad laminate according to claim 1, wherein the first polyimide layer and the second polyimide layer each further comprises in its composition a polymeric unit derived from an aromatic dianhydride monomer.

13. The metal clad laminate according to claim 1, wherein the diamine monomer further comprises an aromatic diamine.

14. The metal clad laminate according to claim 1, wherein the peeling strength between the first polyimide layer and the second polyimide layer is 5 to 50 gf/cm.

15. The metal clad laminate according to claim 1, wherein the first metal foil and the second metal foil are each independently selected from a copper foil, an aluminum foil or a copper aluminum alloy foil.

16. The metal clad laminate according to claim 1, wherein the peeling strength between the first polyimide layer and the second polyimide layer is 8 to 22 gf/cm.

17. A method for preparing the metal clad laminate according to claim 1, comprising:
   (a) providing a first metal film comprising the first metal foil and the first polyimide layer directly disposed on the first metal foil;
   (b) providing a second metal film comprising the second metal foil and the second polyimide layer directly disposed on the second metal foil; and
   (c) superposing the first polyimide layer of the first metal film onto the second polyimide layer of the second metal film and laminating.

18. The method for preparing the metal clad laminate according to claim 17, wherein a lamination temperature in step (c) is controlled to be 300 to 390° C., and a lamination line pressure is controlled to be 1 to 60 kgf/cm, such that the peeling strength between the first polyimide layer and the second polyimide layer is above 3 and below 84 gf/cm.

19. A method for preparing a flexible circuit board comprising:
   providing the metal clad laminate according to claim 13,
   forming at least one circuit unit respectively on the surface of the first metal foil and the second metal foil of the metal clad laminate; and
   separating the first polyimide layer from the second polyimide layer, to form two single-sided flexible circuit boards.

20. A method for preparing a flexible circuit board comprising
   providing the metal clad laminate according to claim 1, and
   forming at least one circuit unit respectively on the surface of the first metal foil and the surface of the second metal foil to prepare a double-sided flexible circuit board.

* * * * *